US009076826B2

(12) United States Patent
de la Llera et al.

(10) Patent No.: US 9,076,826 B2
(45) Date of Patent: Jul. 7, 2015

(54) PLASMA CONFINEMENT RING ASSEMBLY FOR PLASMA PROCESSING CHAMBERS

(75) Inventors: Anthony de la Llera, Fremont, CA (US); David Carman, San Jose, CA (US); Travis R. Taylor, Fremont, CA (US); Saurabh J. Ullal, South San Francisco, CA (US); Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1155 days.

(21) Appl. No.: 13/021,499

(22) Filed: Feb. 4, 2011

(65) Prior Publication Data

US 2012/0073754 A1  Mar. 29, 2012

Related U.S. Application Data

(60) Provisional application No. 61/386,315, filed on Sep. 24, 2010.

(51) Int. Cl.
*C23F 1/00* (2006.01)
*H01L 21/67* (2006.01)

(52) U.S. Cl.
CPC ............................ *H01L 21/67069* (2013.01)

(58) Field of Classification Search
CPC ....................... H01J 37/32623; C23C 16/4585
See application file for complete search history.

(56) References Cited

U.S. PATENT DOCUMENTS

| | | |
|---|---|---|
| 5,534,751 A | 7/1996 | Lenz et al. |
| 5,998,932 A | 12/1999 | Lenz |
| 6,019,060 A | 2/2000 | Lenz |
| 6,178,919 B1 | 1/2001 | Li et al. |
| 6,527,911 B1 | 3/2003 | Yen et al. |
| 6,823,815 B2 * | 11/2004 | Han et al. .................. 118/723 E |
| 6,926,803 B2 | 8/2005 | Antolik |
| 6,936,135 B2 | 8/2005 | Antolik |

(Continued)

FOREIGN PATENT DOCUMENTS

KR  10-2008-0030199 A  4/2008

OTHER PUBLICATIONS

International Search Report and Written Opinion mailed Jun. 26, 2012 for PCT/US2011/001501.

*Primary Examiner* — Gordon R Baldwin
*Assistant Examiner* — Charlee Bennett
(74) *Attorney, Agent, or Firm* — Buchanan Ingersoll & Rooney PC

(57) ABSTRACT

A plasma confinement ring assembly with a single movable lower ring can be used for controlling wafer area pressure in a capacitively coupled plasma reaction chamber wherein a wafer is supported on a lower electrode assembly and process gas is introduced into the chamber by an upper showerhead electrode assembly. The assembly includes an upper ring, the lower ring, hangers, hanger caps, spacer sleeves and washers. The lower ring is supported by the hangers and is movable towards the upper ring when the washers come into contact with the lower electrode assembly during adjustment of the gap between the upper and lower electrodes. The hanger caps engage upper ends of the hangers and fit in upper portions of hanger bores in the upper ring. The spacer sleeves surround lower sections of the hangers and fit within lower portions of the hanger bores. The washers fit between enlarged heads of the hangers and a lower surface of the lower ring. The spacer sleeves are dimensioned to avoid rubbing against the inner surfaces of the hanger bores during lifting of the lower ring.

23 Claims, 21 Drawing Sheets

(56) References Cited

U.S. PATENT DOCUMENTS

| | | |
|---|---|---|
| 7,211,170 B2 | 5/2007 | Antolik |
| 7,296,534 B2 * | 11/2007 | Fink .......................... 118/723 E |
| 7,430,986 B2 | 10/2008 | Dhindsa et al. |
| 7,438,018 B2 * | 10/2008 | Son .......................... 118/723 R |
| 7,470,627 B2 | 12/2008 | Han et al. |
| 7,632,377 B2 | 12/2009 | Lai |
| 7,713,379 B2 | 5/2010 | Rogers |
| 7,732,728 B2 | 6/2010 | Dhindsa et al. |
| 7,740,736 B2 | 6/2010 | Fischer et al. |
| 8,500,952 B2 * | 8/2013 | Dhindsa et al. .......... 156/345.37 |

* cited by examiner

Detail Z

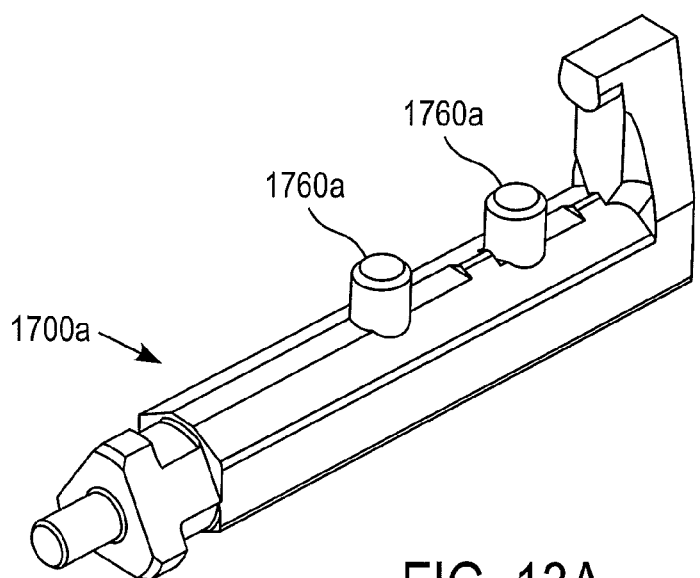 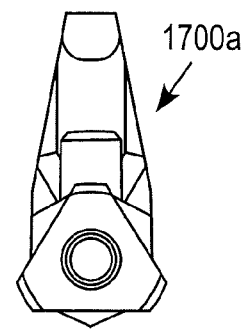
FIG. 13A  FIG. 13B
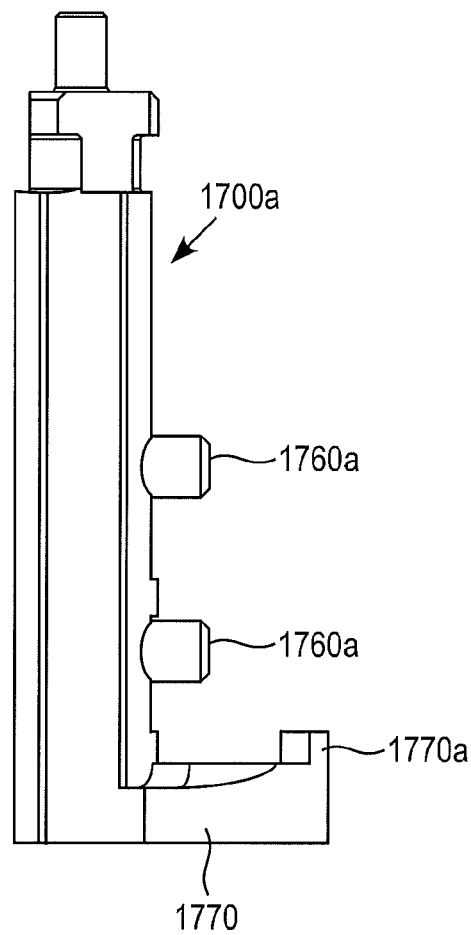 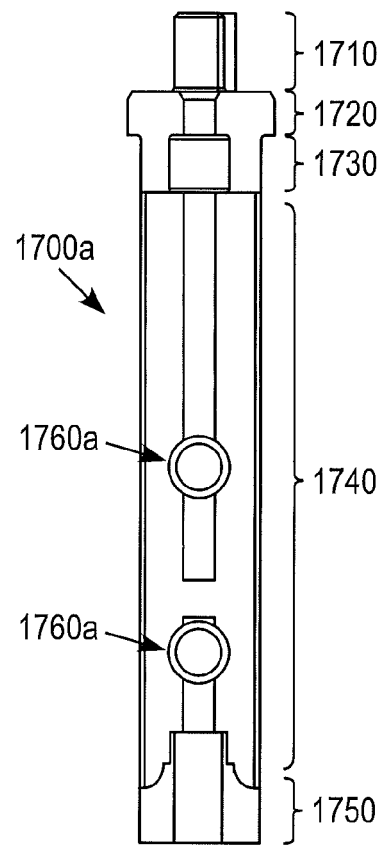
FIG. 13C  FIG. 13D

PLASMA CONFINEMENT RING ASSEMBLY FOR PLASMA PROCESSING CHAMBERS This application claims priority under 35 U.S.C. §119(e) to U.S. Provisional Application No. 61/386,315 entitled Confinement Ring Assembly for Plasma Processing Chambers, filed Sep. 24, 2010, the entire content of which is hereby incorporated by reference.

BACKGROUND

Plasma processing chambers can include an upper electrode and a lower electrode. The upper electrode typically faces a substrate support adapted to support a semiconductor substrate during plasma processing. During the plasma processing, power is supplied to one or both electrodes to activate the process gas and produce the plasma to process the substrate.

Plasma etching can be performed in plasma processing chambers to etch selected materials provided as layers on a semiconductor substrate. The processing conditions are chosen so that the plasma etches desired features in the layers.

As described in commonly-assigned U.S. Pat. No. 7,430,986, during plasma etching in parallel plate capacitively coupled plasma chambers with highly polymerizing process gas chemistries, polymer deposits can form on internal chamber surfaces such as plasma confinement rings. The rings move vertically and as described in commonly-owned U.S. Pat. No. 6,936,135, during wafer processing the confinement rings may be brought closer together with the bottom ring adjacent the substrate support. The vertical movement creates opportunity for moving parts to scrape against each other and generate particles which can cause particle contamination of the processed wafer. Improvements in plasma confinement arrangements which reduce particle generation would be desirable.

SUMMARY

A plasma confinement ring assembly useful for controlling wafer area pressure in a capacitively coupled plasma reaction chamber wherein a wafer is supported on a lower electrode assembly and process gas is introduced into the chamber by an upper showerhead electrode assembly, comprises an upper ring, a lower ring, hangers, hanger caps, optional spacer sleeves and optional washers wherein the lower ring is supported by the hangers and is movable towards the upper ring. The hanger caps engage upper ends of the hangers and fit in upper portions of hanger bores in the upper ring, the optional spacer sleeves surround lower sections of the hangers and fit within lower portions of the hanger bores, and the optional washers fit between enlarged heads of the hangers and a lower surface of the lower ring. The optional spacer sleeves are dimensioned to avoid rubbing against the inner surface of the hanger bore during lifting of the lower ring such as during a gap adjustment between the upper and lower electrodes.

In a modified arrangement, the spacer sleeves and washers are omitted and a middle ring is added to the plasma confinement ring assembly. The hangers include projections which support the middle ring and the spacer sleeves are replaced with projections which limit upward travel of the hangers in the stepped bores of the upper ring. Instead of using washers to support the lower ring, the hangers include flanges with upward projections at their lower ends which support the lower ring sits on the upper surface of the flanges and the outer periphery of the lower ring is inward of the upward projection.

BRIEF DESCRIPTION OF FIGURES

FIGS. 9A-C show details of a modified upper ring 1300 wherein FIG. 9A is a top view, FIG. 9B is a cross sectional view taken in a radial plane passing through the center axis of the upper ring, and FIG. 9C is a cross sectional view in the radial plane at a location of a stepped bore 1350.

FIGS. 11A-F show details of a middle ring 1600 wherein FIG. 11A is a top view of the middle ring, FIG. 11B is a cross section taken in a radial plane passing through the center axis of the middle ring, FIG. 11C is a perspective view of a top portion of middle ring 1600 at a location of a hole 1650, FIG. 11D is a perspective view of a bottom portion of middle ring 1600 at a location of a hole 1650, FIG. 11E is a top view of middle ring 1600 that shows inner slots 1671 and outer slots 1672, and FIG. 11F shows Detail E of FIG. 11E.

FIGS. 12A-B show details of how the upper, middle and lower rings operate wherein FIG. 12A shows the rings in an open position and FIG. 12B shows the rings in a closed position.

FIGS. 13A-D show details of a modified hanger 1700*a* having projections in the form of pins 1760*a* wherein FIG. 13A is a perspective view of the hanger, FIG. 13B is a top view of the hanger, FIG. 13C is a side view of the hanger, and FIG. 13D is a front view of the hanger.

FIGS. 14A-D show details of a modified hanger 1700*b* having integral projections 1760*b* wherein FIG. 14A is a perspective view of the hanger, FIG. 14B is a top view of the hanger, FIG. 14C is a side view of the hanger, and FIG. 14D is a front view of the hanger.

DETAILED DESCRIPTION

Parallel-plate plasma processing chambers, such as capacitively-coupled chambers, include an upper electrode, such as a showerhead electrode, and a lower electrode. The upper electrode typically faces a semiconductor substrate to be processed. During plasma processing, power is supplied to one or both electrodes to activate the process gas and produce the plasma to process the substrate.

Highly-polymerizing process gas chemistries, such as process gases containing fluorocarbons, hydrofluorocarbons, or precursors of such gases, can be used in a plasma processing chamber to etch dielectric materials, such as silicon oxide. During such plasma etch processes, polymer tends to deposit on some internal surfaces of the plasma processing chamber. The polymer deposits are undesirable because they can flake off of the surfaces and contaminate processed substrates (e.g., processed wafers), as well as the chamber. However, as device features continue to shrink, it becomes increasingly desirable to maintain plasma-exposed chamber surfaces clean from wafer-to-wafer to achieve repeatable process results. Accordingly, it is desirable to reduce, and preferably to avoid, such polymer deposits on internal surfaces of chamber parts.

The problem of polymer deposition on plasma-exposed surfaces of some parts in plasma processing chambers can be addressed by actively heating the part(s). For example, chamber walls can be heated to keep their plasma-exposed interior surface(s) at a sufficiently high temperature to avoid polymer deposition on the surface(s). Active temperature control of showerhead electrode assemblies and electrostatic chucks can also be used.

Alternatively, the polymer deposition problem can be addressed by removing as-formed polymer deposits from surfaces. For example, polymer deposits can be removed by employing aggressive plasma chemistries. Alternatively, the plasma chamber can be opened and a wet cleaning technique can be used to remove polymer deposits from chamber surfaces. However, such cleaning techniques reduce process throughput.

In order to achieve desirable process efficiency and etch uniformity, plasma can be confined within a plasma confinement zone defined between the upper and lower electrodes of a parallel-plate plasma processing chamber. Plasma confinement ring assemblies can be used to provide such plasma confinement. Exemplary plasma confinement ring assemblies are disclosed in commonly-owned U.S. Pat. Nos. 5,534,751; 5,998,932; 6,019,060; 6,178,919, 6,527,911, 7,713,379, 7,430,986, 6,936,135 and 6,926,803, each of which is incorporated herein by reference in its entirety.

Figure 1A:
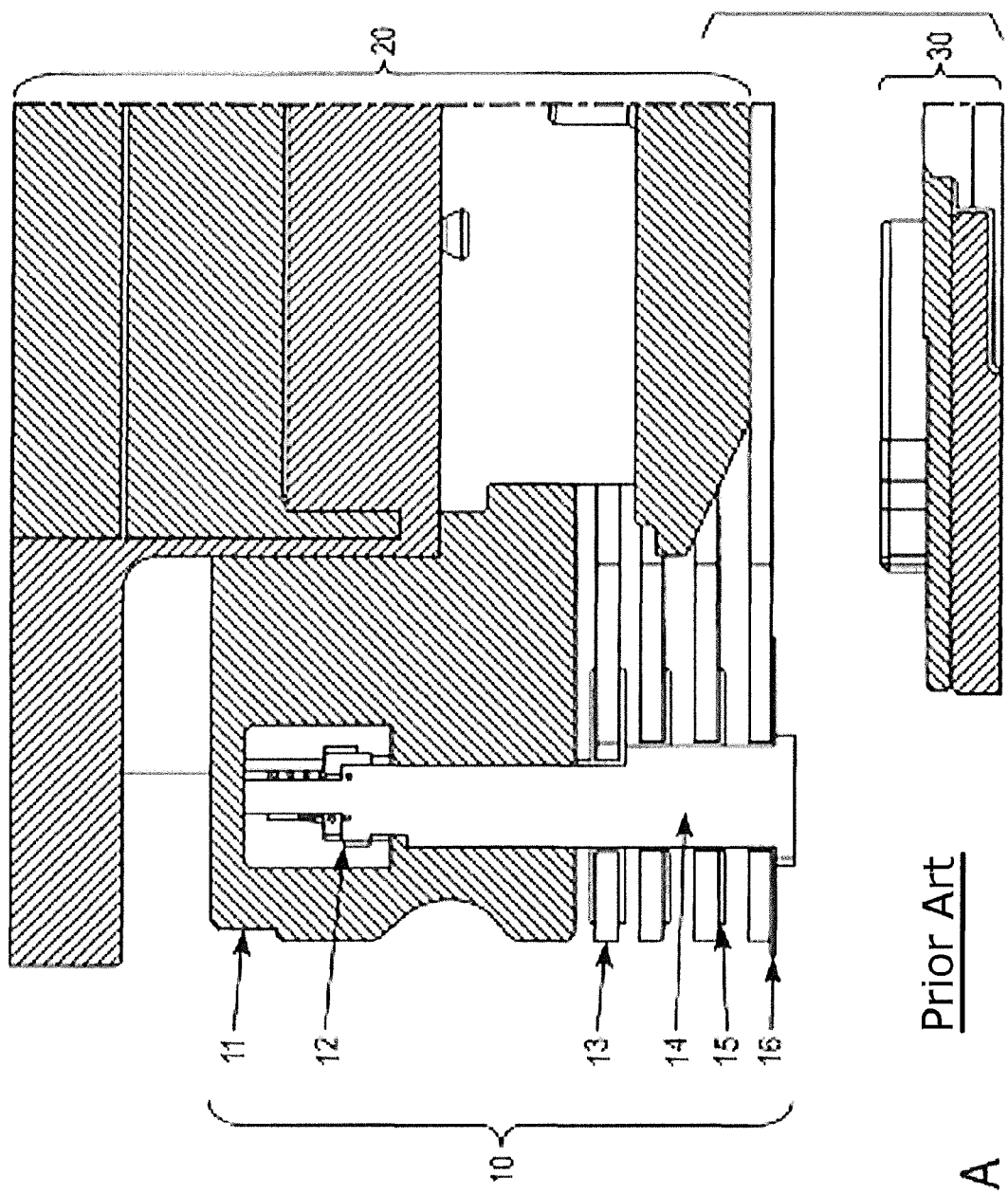
FIG. 1A shows a conventional plasma confinement ring assembly in the stowage position.
Figure 1B:
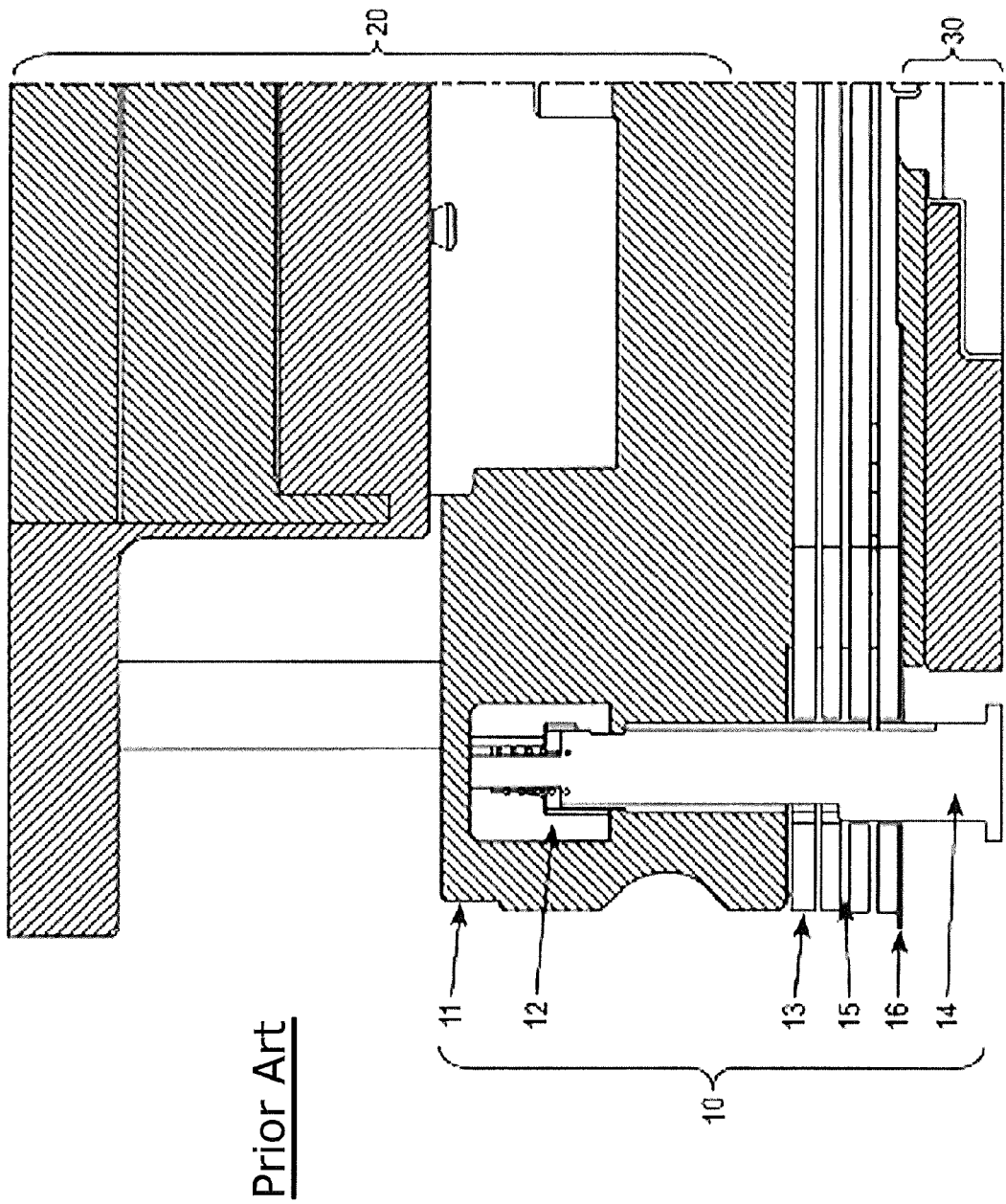
FIG. 1B shows a convention plasma confinement ring assembly in the deployment position.

A conventional plasma confinement ring assembly 10 as shown in FIGS. 1A and 1B can include an upper ring 11 and a plurality of lower rings 13. The upper ring 11 and the lower rings 13 are arranged in a stack to define a plurality of gas passages extending radially between the upper and lower rings 11 and 13. Charged particles in the plasma are neutralized as the particles pass through the passages, thereby minimizing the tendency for a discharge outside a plasma confinement zone (i.e., "unconfinement" of the plasma) defined by the space between an upper electrode assembly 20 and a lower electrode assembly 30. The upper ring 11 has a plurality of holes aligned with a plurality of holes of each of the lower rings 13. A plurality of hangers 14 are disposed through the aligned holes in the upper ring 11 and the lower rings 13. The hangers 14 are held in place by a plurality of retainers 12. The lower rings 13 can slide axially along the hangers 14. Each hanger 14 has an enlarged section at its lower end. A plurality of washers 15 are disposed around each hanger 14 to separate adjacent rings 11 and 13. The lowest lower ring 13 is separated from the enlarged sections of the hangers 14 by pads 16.

FIGS. 1A and 1B show the plasma confinement ring assembly 10 at a stowage position and a deployment position, respectively. When the plasma confinement ring assembly 10 moves from the stowage position to the deployment position, the plasma confinement ring assembly 10 moves downward. At a certain point, the pad 16 engages the lower electrode assembly 30. The plasma confinement ring assembly 10 continues to move downward until the lower rings 13 fully collapse together and are pushed towards the upper ring 11 by the lower electrode assembly 30.

Plasma processing is conducted when the plasma confinement ring assembly 10 is at the deployment position, wherein a portion of the hanger 14 between the rings 11 and 13 (i.e. in the passages) is exposed to plasma and can have polymer deposition over time. As the plasma confinement ring assembly 10 moves between the stowage position and the deployment position, the washers 15, the pads 16 and the lower rings 13 slide along and can rub against the hangers 14, which can dislodge the polymer deposition thereon and cause particulate contamination of semiconductor substrates processed in a plasma processing chamber equipped with the plasma confinement ring assembly 10.

Figure 2B:
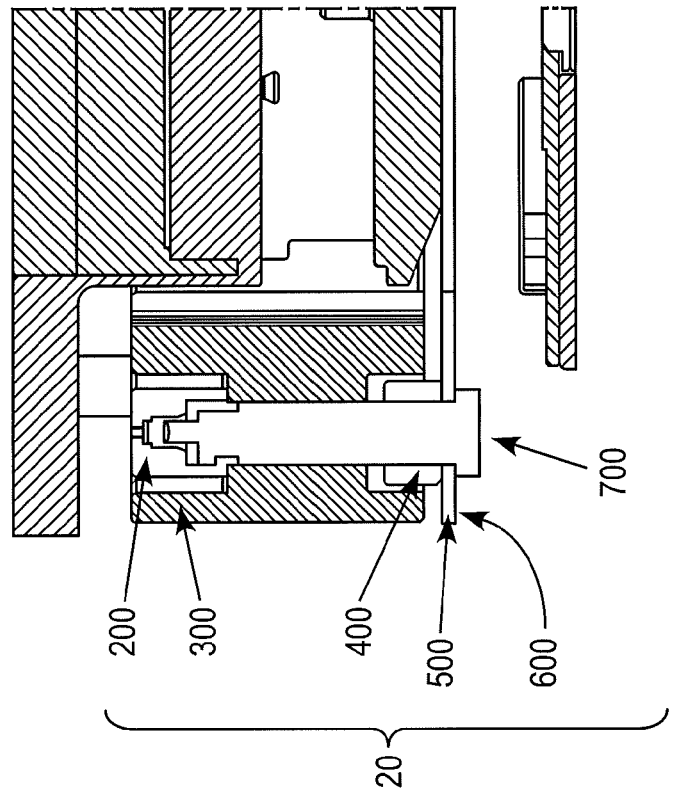
FIG. 2B shows a cross sectional view of the plasma confinement ring assembly of FIG. 2A in the deployment position.
Figure 2A:
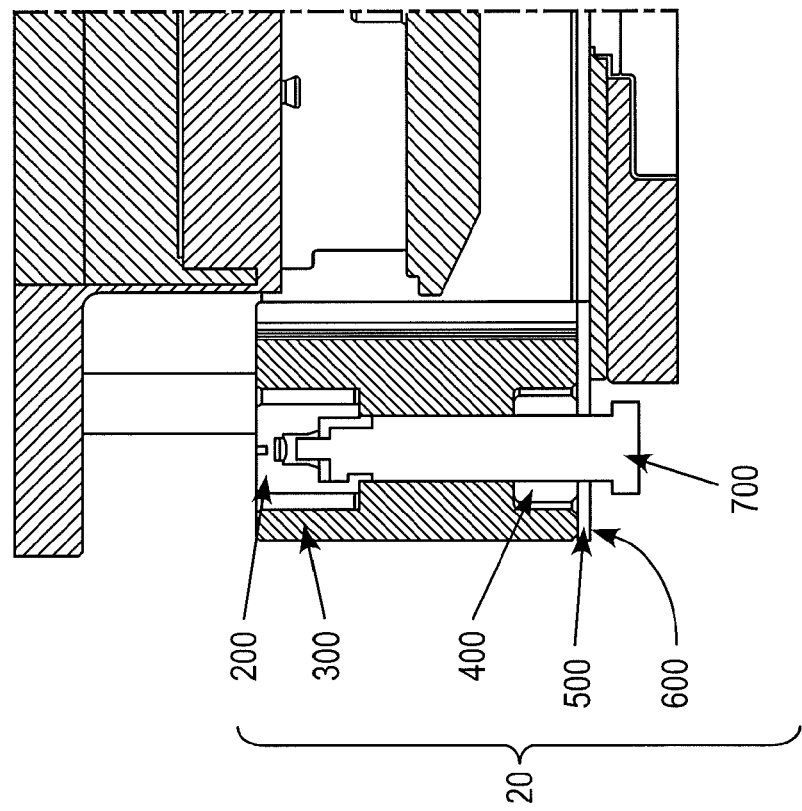
FIG. 2A shows a cross sectional view of a plasma confinement ring assembly in the stowage position, according to an embodiment.
Figure 2C:
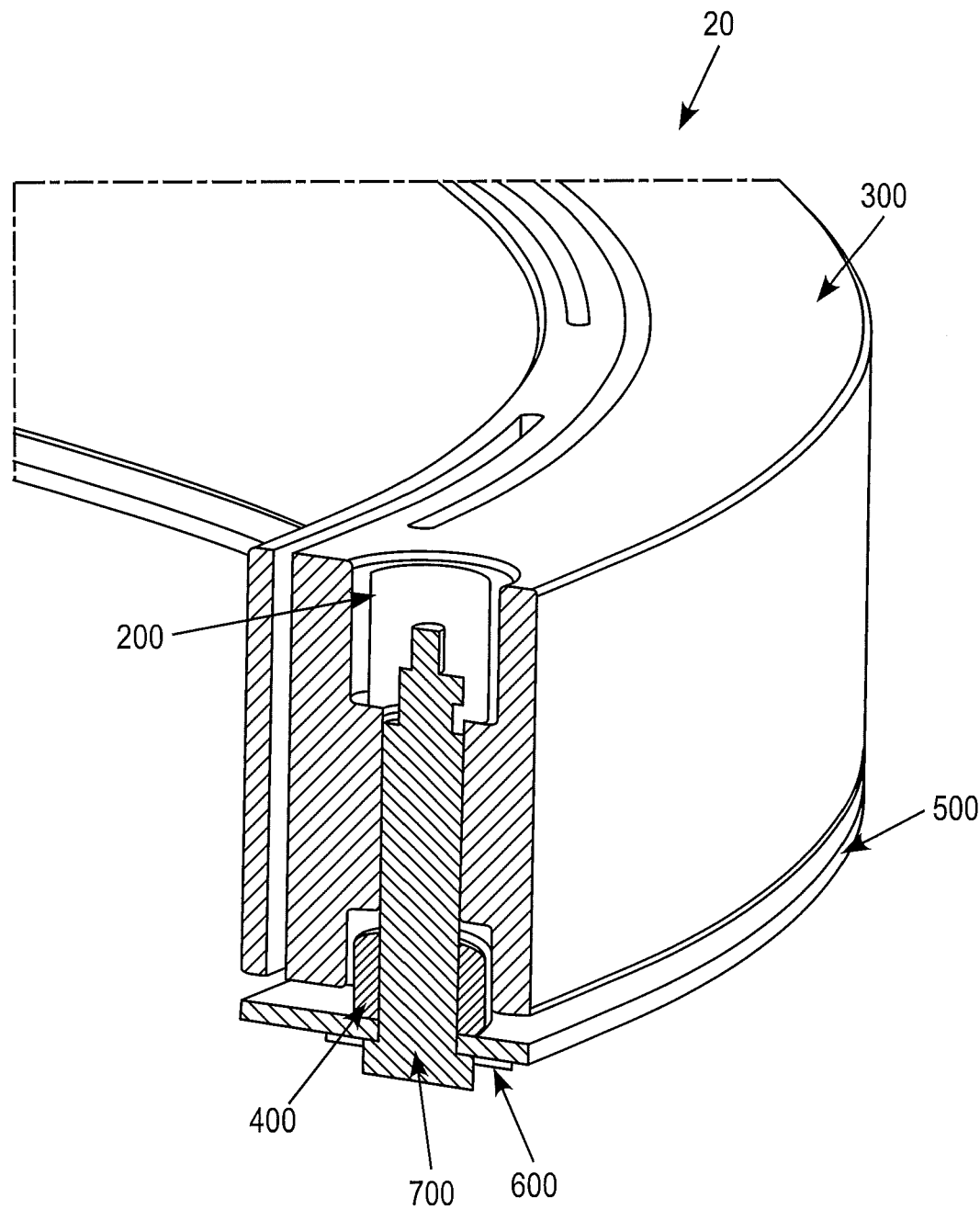
FIG. 2C shows a perspective view of a plasma confinement ring assembly of FIG. 2A in the stowage position.

Described herein is a plasma confinement ring assembly 20, which eliminates the undesirable rubbing in the plasma confinement ring assembly 10 and thus reduces particulate contamination caused thereby. In one embodiment as shown in FIGS. 2A, 2B and 2C, the plasma confinement ring assembly 20 comprises an upper ring 300, a lower ring 500, a plurality of hangers 700, a plurality of spacers sleeves 400, a plurality of hanger caps 200 and a plurality of washers 600. In this embodiment, the upper ring 300 has a plurality of bores and the lower ring 500 has a plurality of bores corresponding to the plurality of bores in the upper ring 300. The hangers 700 are disposed through these bores in the upper ring 300 and the lower ring 500. The hanger caps 200 are attached to the hangers 700 and prevent the hangers 700 from being pulled out in the direction from the upper ring 300 to the lower ring 500. The hangers 700 each have an enlarged bottom section extending below a bottom wall of the upper ring 300. The lower ring 500 is supported on the washers 600 that are disposed around the hangers 700. The spacer sleeve 400 are disposed around the hangers 700 and are supported on the lower ring 500. The spacer sleeve 400, the lower ring 500 and the washers 600 can slide in the axial direction along the hangers 700 without an outer wall of the spacer sleeve 400 contacting the upper ring 300. The enlarged bottom sections of the hangers 700 support the lower ring 500, the spacer sleeve 400 and the washers 600.

Figure 3A:
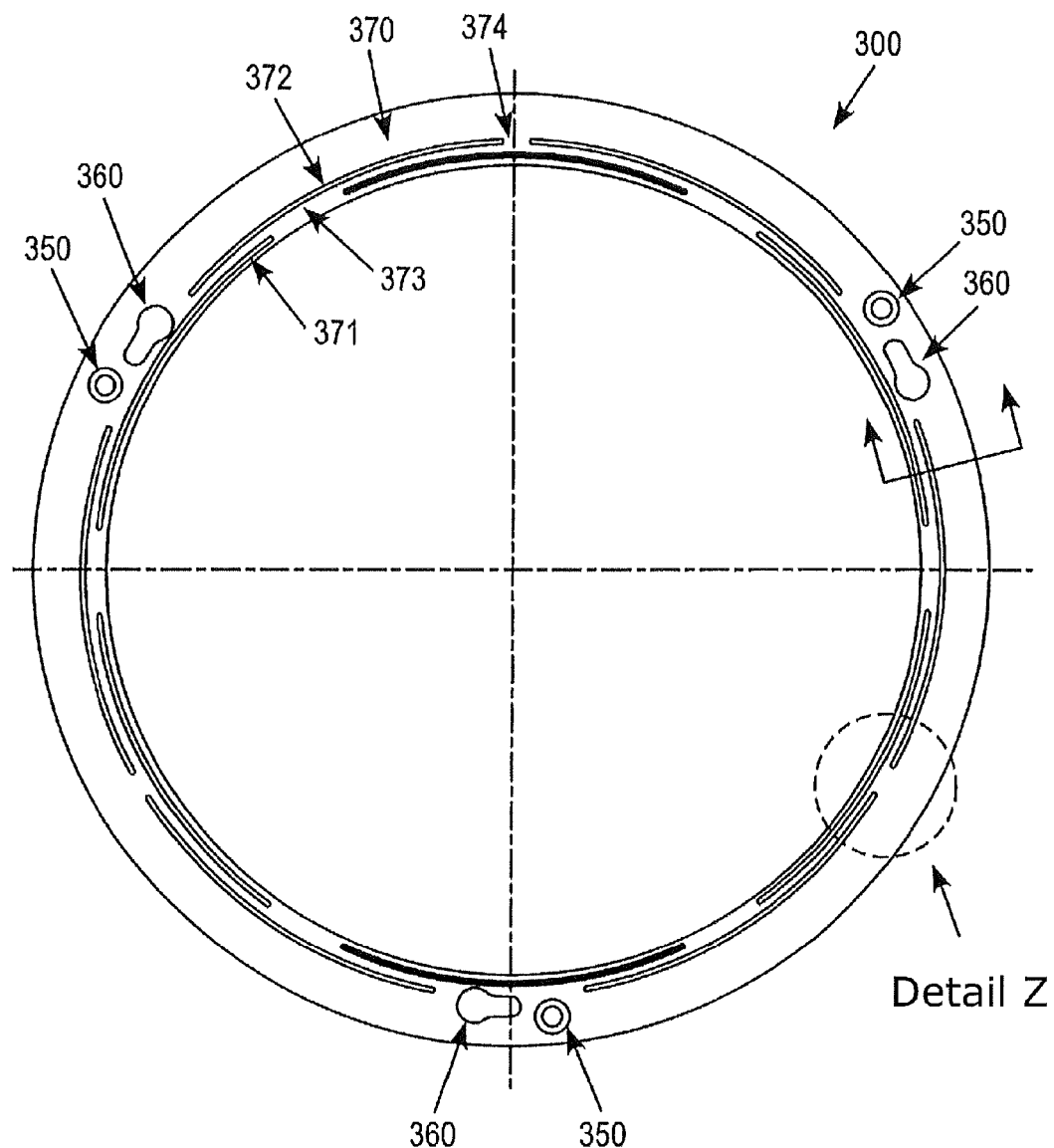
FIG. 3A shows a top view of an upper (twist and lock) ring of the plasma confinement ring assembly of FIG. 2A.
Figure 3B:
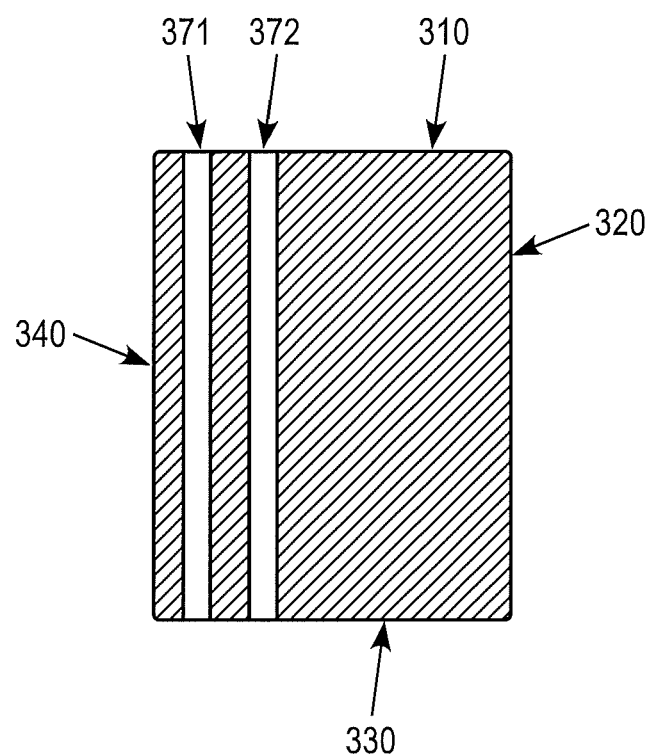
FIG. 3B shows a cross sectional view of the upper ring of FIG. 3A.
Figure 3C:
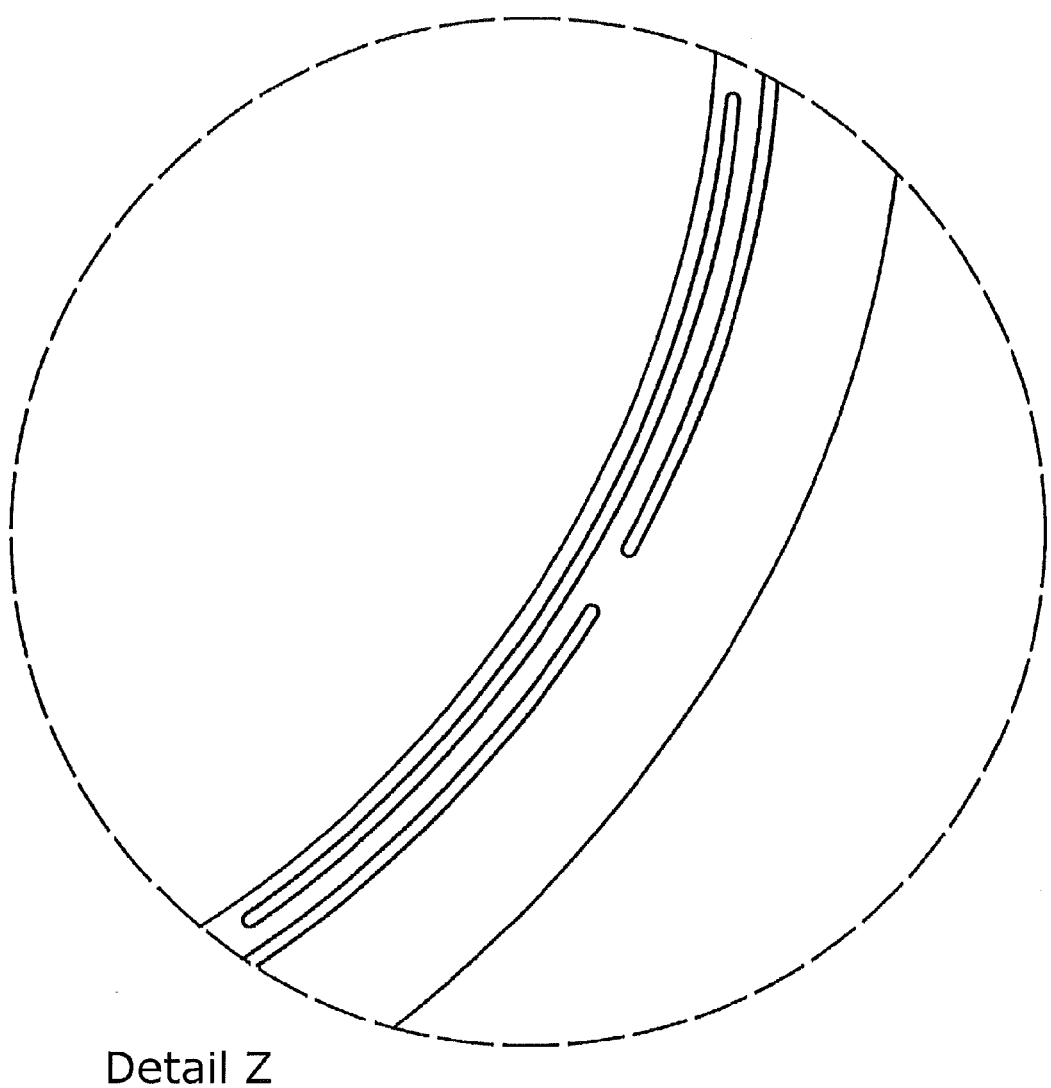
FIG. 3C shows a top view of a thermal choke in the upper ring of FIG. 3A.
Figure 3D:
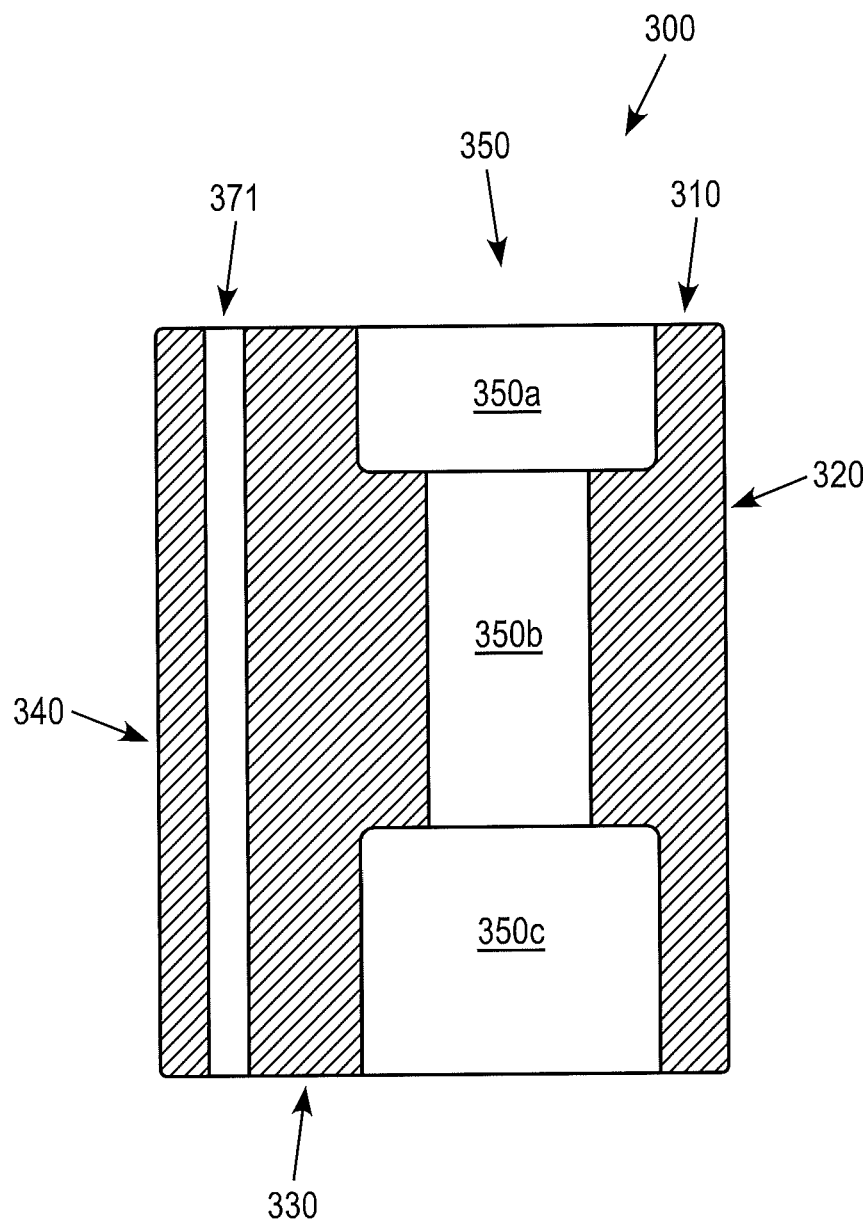
FIG. 3D shows another cross sectional view of the upper ring of FIG. 3A, through a double counterbored hole.

FIGS. 3A-3D show details of the upper ring 300 according to an embodiment. The upper ring 300 has an upper wall 310, an outer wall 320, a lower wall 330 and an inner wall 340. The upper ring 300 has three double counterbored holes 350 extending between the upper wall 310 and the lower wall 330, the double counterbored holes 350 each having an upper section 350a in the upper wall 310, a lower section 350c in the lower wall 330 and a middle section 350b with a smaller diameter than the upper and lower sections 350a and 350c. The holes 350 preferably are evenly spaced azimuthally. The upper ring 300 preferably has three twist-and-lock bores 360 in the upper wall 310, the twist-and-lock bores 360 adapted to engage with vertically movable plungers mounted in a top wall of a plasma processing chamber such that the plasma confinement ring assembly 20 is supported by the plungers by inserting free ends of the plungers in the twist-and-lock bores 360 and rotating the plasma confinement ring assembly 20 to lock the plungers in narrow ends of the twist-and-lock bores 360. Details of a cam-based arrangement for supporting and operating the plungers can be found in commonly-owned U.S. Pat. No. 6,019,060, the disclosure of which is hereby incorporated by reference. The bores 360 have an internal depth sufficient to allow heads of the plungers to move vertically down into the bores to accommodate vertical movement of the upper ring 300 when the lower ring 500 engages the lower electrode assembly during a gap adjustment and lifts the upper ring 300 when upper ends of the sleeves 400 reach the limit of their travel in the lower section 350c of bores 350. See, for example, commonly-owned U.S. Pat. No. 6,926,803, the disclosure of which is hereby incorporated by reference. The upper ring 300 further preferably has a thermal choke 370. The thermal choke 370 comprises a plurality of inner slots 371 arranged in a discontinuous first circular pattern, and a plurality of outer slots 372 spaced outwardly from the inner slots 371 and arranged in a concentric discontinuous second circular pattern. Adjacent inner slots 371 are separated by inner regions 373, and adjacent outer slots 372 are separated by outer regions 374. As shown in FIG. 3A, the inner regions 373 and outer regions 374 are offset from each other around the upper plasma confinement ring 300. The inner slots 371 and the outer slots 372 preferably extend completely through the thickness of the plasma confinement ring 300 (i.e. between the upper wall 310 and the lower wall 330). This construction and placement of the thermal choke 370 reduces radial heat dissipation from the inner wall 320 so that the inner wall 320 reaches a sufficiently high temperature to substantially prevent polymer deposition thereon during plasma processing. The inner slots 161 and outer slots 163 preferably have a width of from about 0.05 inch to about 0.2 inch. The upper ring 300 preferably has an inner diameter of about 17 inches and a height from about 1 to 2 inches.

Figure 4A:
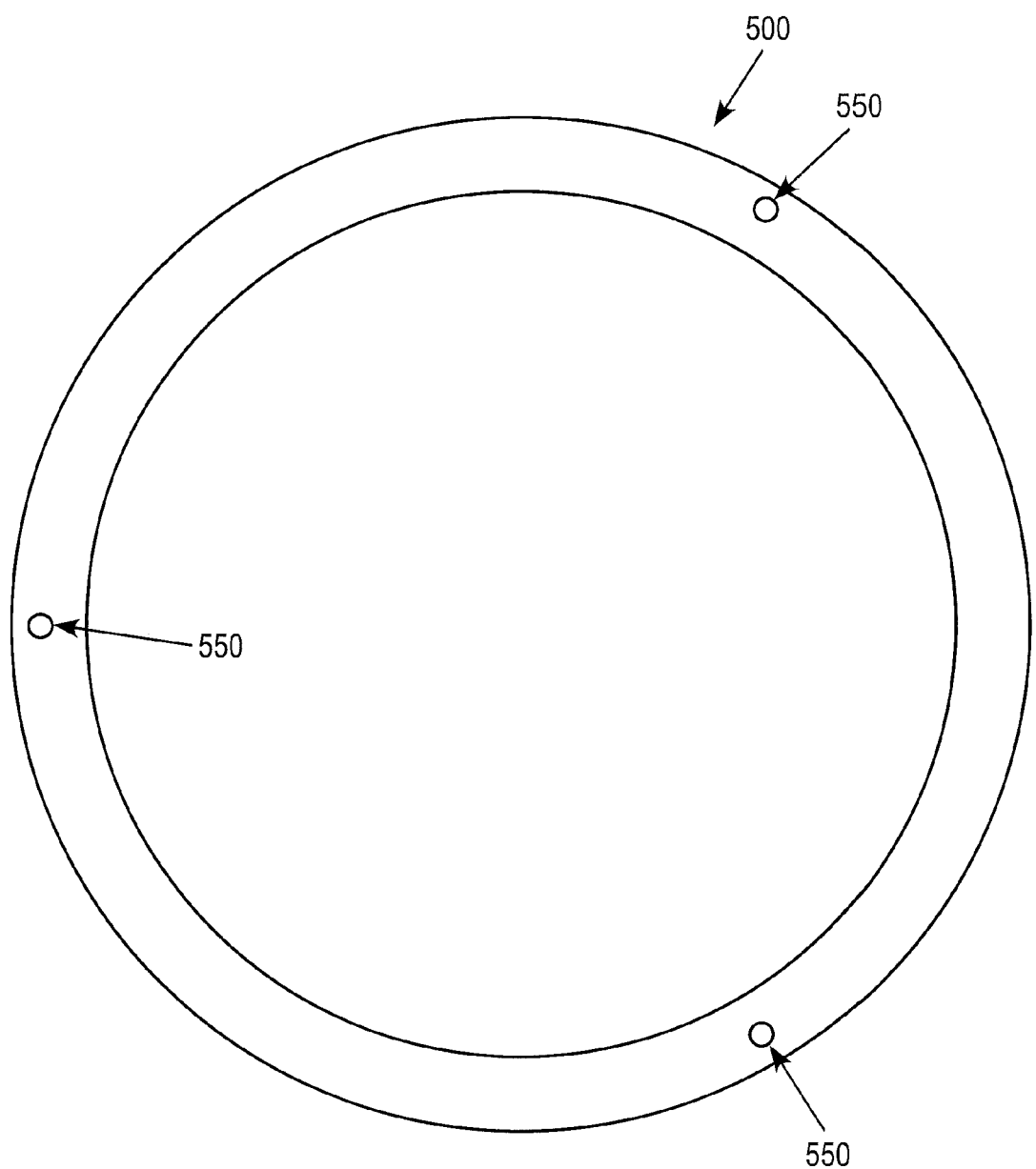
FIG. 4A shows a top view of a lower ring of the plasma confinement ring assembly of FIG. 2A.
Figure 4B:
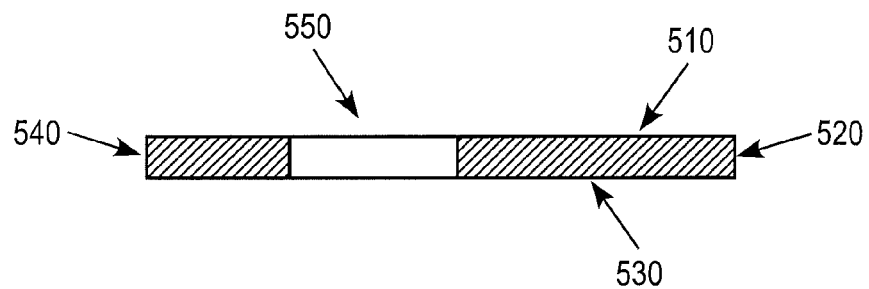
FIG. 4B shows a cross sectional view of the lower ring of FIG. 4A.

FIGS. 4A and 4B show details of the lower ring 500 according to an embodiment. The lower ring 500 has an upper wall 510, an inner wall 520, a lower wall 530 and an outer wall 540. The lower ring 500 further has three through holes 550 extending from the upper wall 510 to the lower wall 530 and corresponding to the three double counterbored holes 350 in the upper ring 300. The lower ring 500 preferably has a thickness of about 0.005 to 0.1, preferably about 0.01 inch and is made of a dielectric material such as semiconductor processing compatible PEEK. The lower ring 500 preferably has about the same inner diameter as the upper ring 300. The lower ring 500 is preferably made of an electrically insulating material such as quartz.

Figure 5A:
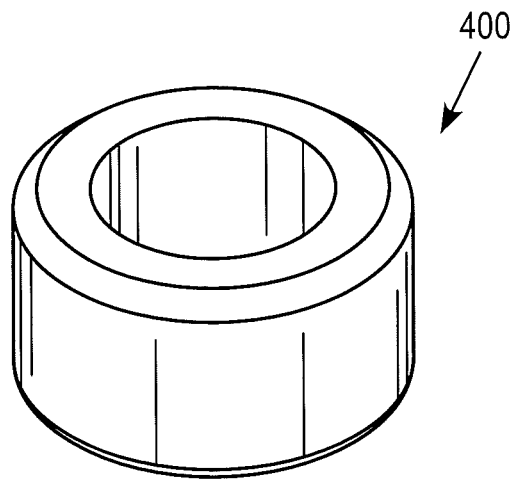
FIG. 5A shows a perspective view of a spacer sleeve of the plasma confinement ring assembly of FIG. 2A.
Figure 5B:
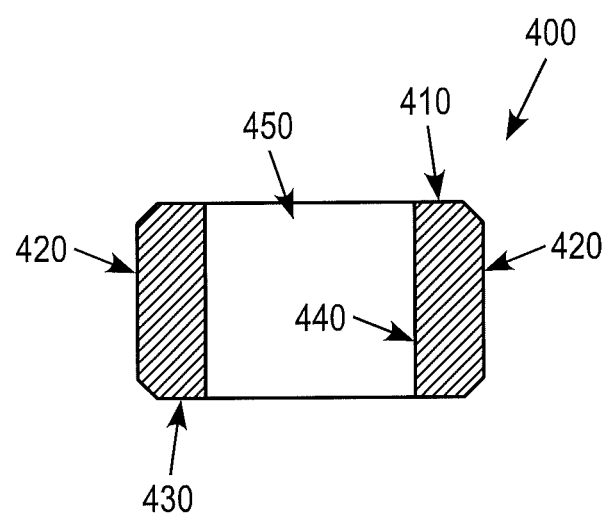
FIG. 5B shows a cross sectional view of the spacer sleeve of FIG. 5A.

FIGS. 5A and 5B show details of the spacer sleeves 400 according to an embodiment. Each spacer sleeve 400 has an upper wall 410, an inner wall 440, an outer wall 420, a lower wall 430 and a through hole 450 extending between the upper wall 410 and the lower wall 430. An upper outer edge and a lower outer edge of the spacer sleeve 400 preferably have 45° chamfers. The spacer sleeve 400 is sized to fit in the lower section 350c of bore 350 in the lower wall 330 of the upper ring 300. The spacer sleeve 400 preferably has an outer diameter smaller than an inner diameter of the lower section 350c so that the spacer sleeve 400 does not rub against an inner wall of the lower section 350c when the spacer sleeve 400 slides along the hanger 700 disposed in the double counterbored hole 350. The spacer sleeve 400 preferably has the same height as the depth of the lower section 350c. The through hole 450 can have about the same diameter as the middle section 350b of the hole 350.

Figure 6A:
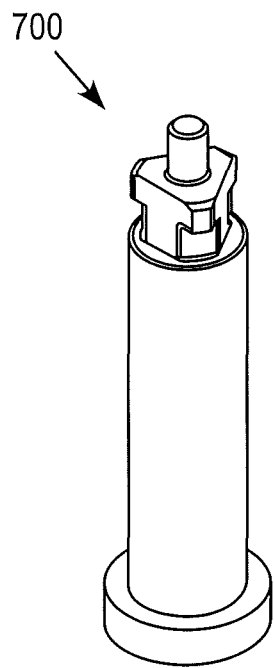
FIG. 6A shows a perspective view of a hanger of the plasma confinement ring assembly of FIG. 2A.
Figure 6B:
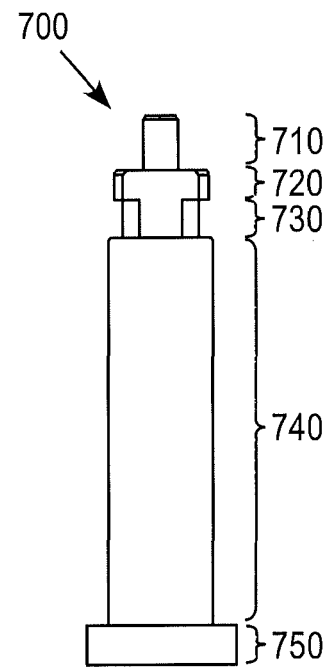
FIG. 6B shows a side view of the hanger of FIG. 6A.
Figure 6C:
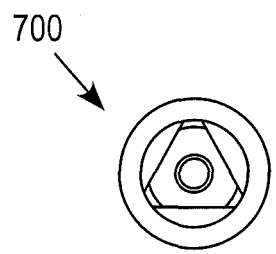
FIG. 6C shows a top view of the hanger of FIG. 6A.

FIGS. 6A-6C show details of the hanger 700 according to an embodiment. The hanger 700 has, from top to bottom, a first cylindrical section 710, a second truncated triangular prism section 720, a third truncated triangular prism section 730 which is smaller than the second section 720, a fourth cylindrical section 740, and a fifth cylindrical section (i.e. the enlarged bottom section) 750 which is larger in diameter than the fourth section. The hanger 700 is preferably made of an electrically insulating material such as PEEK. An outer diameter of the fourth cylindrical section 740 is preferably slightly smaller than the inner diameter of the middle section 350b of the hole 350 in the upper ring 300 such that the hanger 700 can slide in the hole 350 without rubbing of opposed surfaces.

Figure 7A:
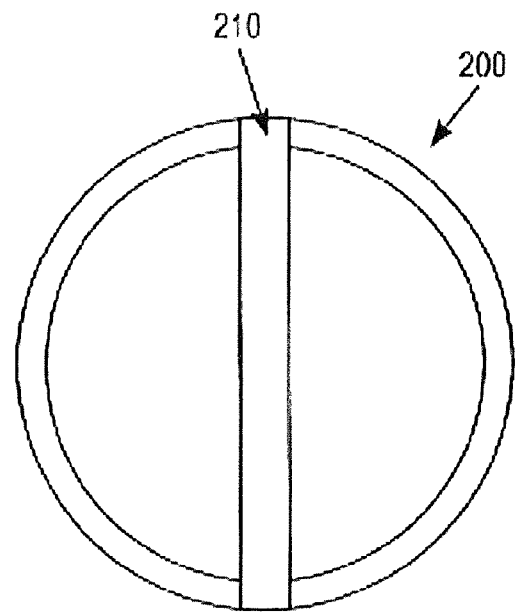
FIG. 7A shows a top view of a hanger cap of the plasma confinement ring assembly of FIG. 2A.
Figure 7B:
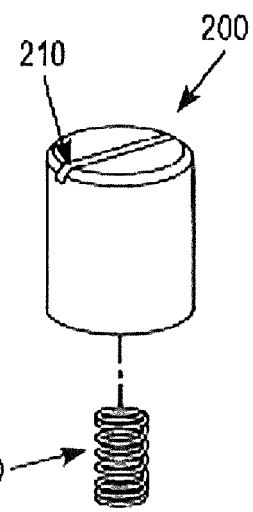
FIG. 7B shows a perspective view of the hanger cap of FIG. 7A.
Figure 7C:
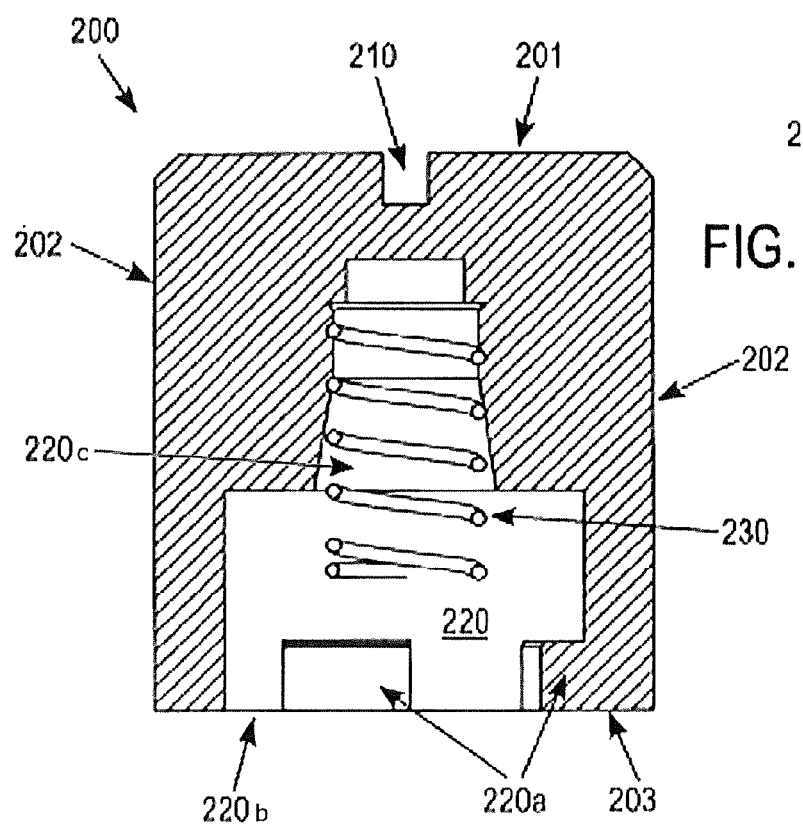
FIG. 7C shows a cross sectional view of the hanger cap of FIG. 7A.

FIGS. 7A-7C show details the hanger cap 200 according to an embodiment. The hanger cap 200 has an upper wall 201, an outer wall 202 and a lower wall 203. The upper wall 201 preferably has a slot 210 for engaging a tool such as a screw driver. The hanger cap 200 preferably has the same height as the upper section 350a of the hole 350 in the upper ring 300 and has a smaller outer diameter than that of the upper section 350a. When the hanger cap 200 fits in the upper section 350a, the upper wall 202 preferably is coextensive with the upper wall 310 of the upper ring 300. The outer diameter of the hanger cap 200 preferably is larger than the diameter of the middle section 350b of the hole 350 such that when the hanger cap 200 is attached to the hanger 700, it prevents the hanger 700 from being pulled out of the hole 350. The hanger cap 200 can be secured to the hanger 700 by a suitable mechanism. For example, the hanger cap 200 can have an internal cavity 220 open in the lower wall 203, with a spring 230 disposed in the internal cavity 220; the cavity 220 has three projections 220a at its opening in the lower wall 203. The first, second and third sections 710, 720 and 730 of a hanger can be inserted into the cavity 220 and twisted so that the second section 720 loads the spring 230 which urges the second section 720 against the projection 220a. In an embodiment, the hanger cap 200 can include a stepped bore 220b in the lower wall 203 thereof wherein a helical spring 230 can be press fitted in a small diameter upper section 220c of the stepped bore 220b.

The washer 600 has a through hole with a diameter smaller than an outer diameter of the fifth section 750 of the hanger 700 and not smaller than the outer diameter of the fourth section 740 of the hanger 700. The washer is made of an electrically insulating material such as PEEK.

Figure 8A:
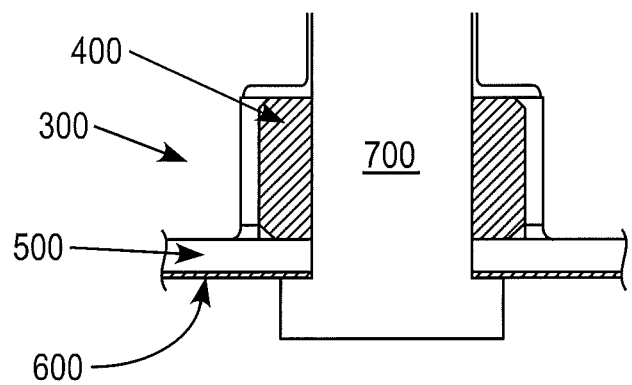
FIG. 8A shows an enlarged view of the of the plasma confinement ring assembly of FIG. 2A in the deployment position.
Figure 8B:
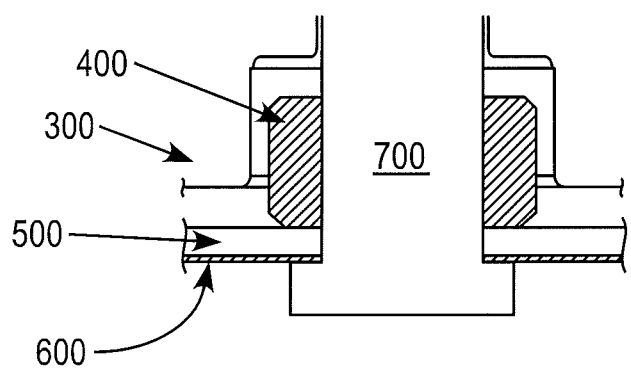
FIG. 8B shows an enlarged view of the of the plasma confinement ring assembly of FIG. 2A in the stowage position.

FIGS. 8A and 8B show enlarged portions of the plasma confinement ring assembly 20 in the deployment position and the stowage position, respectively. In the deployment position, a portion of the outer wall 420 of the spacer sleeve 400 as indicated by the dotted boxes is exposed to plasma during processing and thus can have polymer deposition. The spacer sleeve 400, however, does not rub against the upper ring 300 as explained hereinabove, therefore particulate contamination from the polymer deposition is substantially reduced.

A method of assembling the plasma confinement ring assembly 20, according to an embodiment, includes (a)

inserting each hanger 700 into a washer 600; (b) inserting the hangers 700 into the hole 550 of the lower ring 500; (c) inserting each hanger 700 into a spacer sleeve 400; (d) inserting the hangers 700 into the holes 350 of the upper ring 300; (e) attaching a hanger cap 200 onto each hanger 700 and (f) rotating the hanger 700 to engage projections of the hanger with seats in the hanger cap.

In a preferred embodiment, the upper ring 300 has parallel inner and outer sidewalls 320, 340 and parallel upper and lower walls 310, 330 which are perpendicular to the sidewalls. The upper ring 300 with the lower ring 500 supported by the hangers 700 has a vertical length of about 2.155 inches except when the lower ring 500 is lifted by contact of the washer 600 with an outer upper periphery of the substrate support 30 during adjustment of a gap between the upper and lower electrodes. Typically, the gap may be adjusted to vertical distances of 1 to 6 cm, e.g., 1.6 cm, 2.3 cm or 3.6 cm. The vertical distance that the lower ring 500 travels before an upper end of the spacer sleeve 400 contacts an upper wall of the upper section 350c in the upper ring 300 can be about 0.05 to 0.2 inches, preferably about 0.07 to 0.12 inch. During such movement of the lower ring 500, the upper ring 300 remains in the same position until the spacer sleeve 400 engages the upper wall of the lower section 350c after which the upper and lower rings are lifted.

In a preferred embodiment, the upper ring 300m is sized to have a gap between its inner wall and an outer wall of the upper electrode assembly. For example, the upper ring can have an inner diameter of about 17 inches, an outer diameter of about 20 inches and a thickness of about 2 inches. The twist-and-lock bores 350 can be located on a radius of about 9.2 inches and the hanger bores 360 can be located on a radius of about 9.4 inches.

The upper ring 300 includes three twist-and-lock bores 360 and three hanger bores 350 adjacent the bores 360. The bores 360 have a wide diameter portion sized to allow a plunger to enter the bore 360 and a narrow portion offset about 5° from the wide portion. The wide portion and narrow portion are connected by an annular channel sized to allow movement of an enlarged head of a lower end of the plunger from the entry position to a locked position at which a smaller diameter portion of the plunger is located in the narrow portion of the bore 360. To lock the plunger in the locked position, the channel has a vertical step which prevents the head of the plunger from moving towards the wide portion of the bore 360 unless the plunger is depressed and moved in a circumferential direction relative to the upper wall 310 of the upper ring 300.

In the preferred embodiment, the hanger bores 350 extend through the upper and lower walls of the upper ring 300. The bores 350 preferably have an upper section 350a which is about 0.64 inch deep and about 0.75 inch in diameter, a lower section 350c which is about 0.38 inch deep and about 0.75 inch in diameter, and a middle section 350b connecting the sections 350a, 350c, section 350c being about 0.925 inch in length and about 0.41 inch in diameter.

The upper ring 300 preferably includes six inner slots 371 and six outer slots 372 located between the inner wall 340 and the middle radius of the upper ring 300. Each of the slots can extend 40 to 55°, preferably about 48° with ends of the inner slots being spaced about 12° apart and three pairs of the outer slots spaced about 4° apart and the other three pairs of outer slots spaced about 20° apart. The inner slots can be located on a radius of about 8.92 inches and the outer slots can be located on a radius of about 8.86 inches.

Each of the hangers 700 preferably has a length of about 2 inches and includes four vertically spaced sections with different cross sections. The first section is an upper cylindrical section about 0.2 inch in length and 0.13 inch in diameter. The second section is a triangular section about 0.255 inch in length with three planar walls parallel to a center axis of the hanger located about 0.125 inch from the center axis, the three walls having equal widths and oriented 60° with respect to each other. Upper ends of the of the three walls are wider than lower ends of the walls to form three projections extending about 0.2 inch from the center axis of the hanger. The planar walls are T-shaped and lower ends of the planar walls are connected by cylindrical wall sections having a vertical length of about 0.145 inch and a diameter of about 0.3 inch. The third section is cylindrical with a length of about 1.45 inches and a diameter of about 0.4 inch. The fourth section is cylindrical and has a length of about 0.15 inch and a diameter larger than the third section, e.g. about 0.42 inch.

The spacer sleeve 400 preferably is cylindrical with a length of about 0.39 inch, outer diameter of about 0.67 inch and inner diameter of about 0.41 inch. Upper and lower edges of the spacer sleeve 400 preferably include 45° chamfers extending about 0.04 inch.

The washers 600 preferably have an outer diameter of about 1.25 inches, an inner diameter of about 0.42 inch and thickness of about 0.01 inch.

The lower ring 500 preferably has an outer diameter of about 20 inches, an inner diameter of about 17 inches, and a thickness of about 0.09 inch. The three holes to receive the hangers can have a diameter of about 0.42 inch located on a radius of 9.44 inches and spaced 120° apart.

In a further embodiment, the spacer sleeves and washers are eliminated and a middle ring is added to the plasma ring confinement assembly. Each hanger is modified to include a lower projection which engages a seat in the bottom surface of the middle ring and an upper projection which limits upward travel of the hanger in the stepped bore of the upper ring. Instead of using washers to support the lower ring, each hanger includes a flange with an upward projection at its lower end whereby the lower ring sits on the upper surface of the flange and the outer periphery of the lower ring is inward of the upward projection. The elimination of the spacer sleeves and washers minimizes the contact between the hangers and the confinement ring (to minimize rubbing) and areas that do make contact are located on the "backside" of the hanger (opposite side from the plasma to prevent line of sight to the plasma). This is useful for certain processes such as the Metal Hard Mask (MHM) process which creates nonvolatile etch byproducts (TiOF) that deposit on the PEEK hangers because they are colder than the quartz confinement rings. The modified arrangement minimizes rubbing between the PEEK hangers and quartz confinement rings to avoid generation of particles.

In this embodiment, the middle ring includes slots which act as thermal breaks to keep the part hot and prevent polymer deposition. The thin bottom ring contains features that allow the hanger and the bottom two rings to mate together when the rings are fully collapsed. To minimize particles, all PEEK to PEEK contact is eliminated by modifying the hanger design. The support arrangement utilizes 3 hangers and no washers. The hangers can have projections to support the middle ring and control the spacing between the middle and lower rings.

Figure 9A:
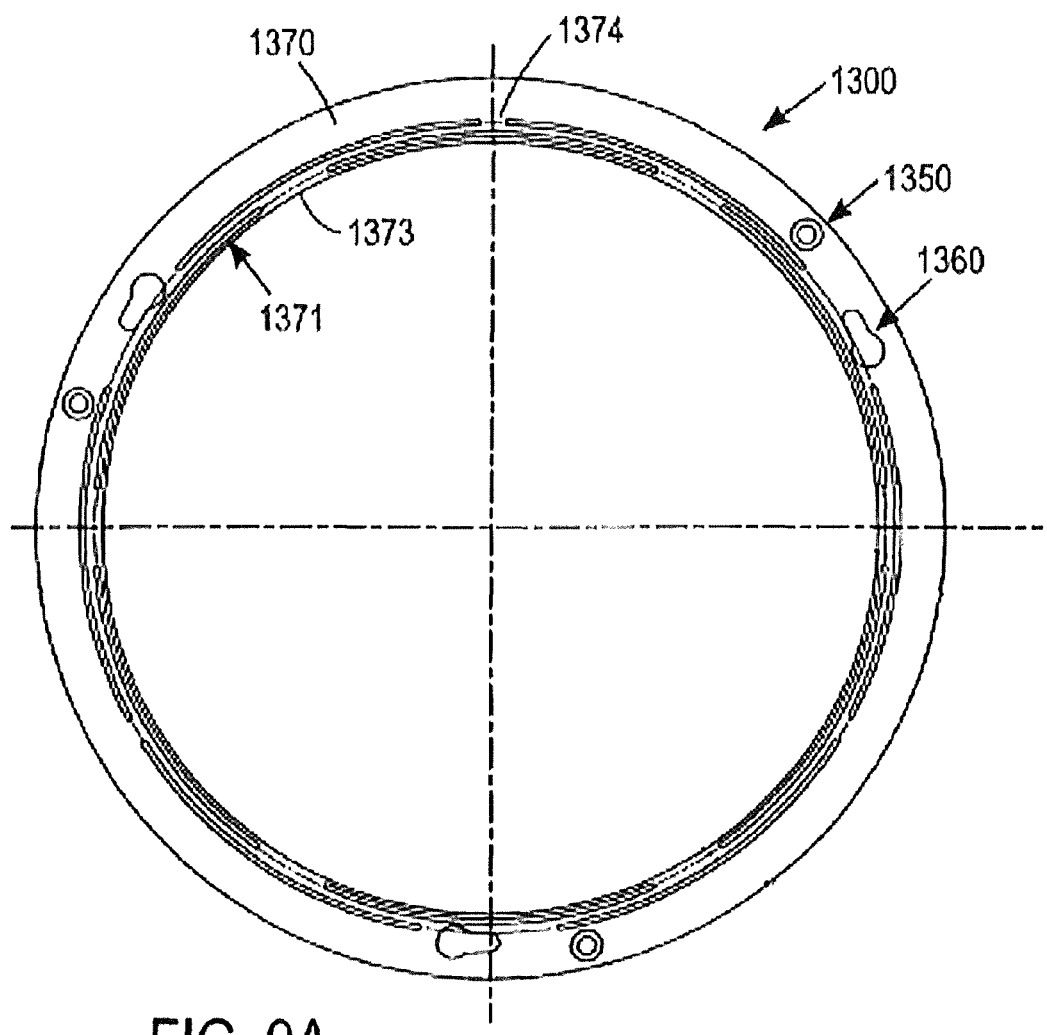
Figure 9B:
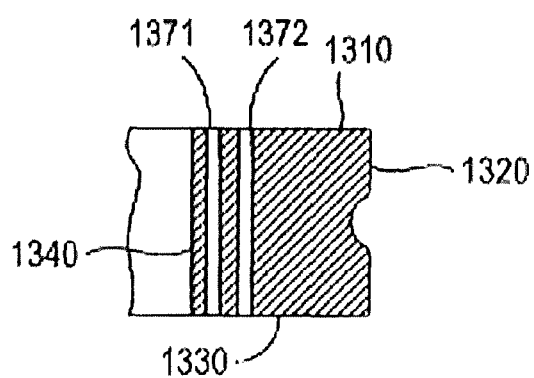
Figure 9C:
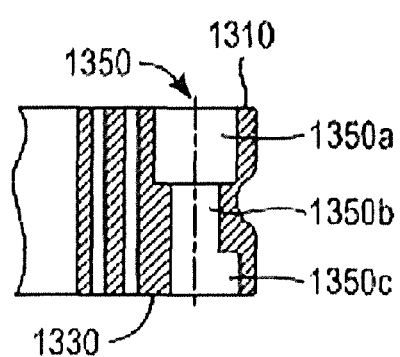

FIGS. 9A-C shows details of the upper ring 300A according to an embodiment. The upper ring 1300 has an upper wall 1310, an outer wall 1320, a lower wall 1330 and an inner wall 1340. The upper ring 1300 has three double counterbored holes 1350 extending between the upper wall 1310 and the lower wall 1330, the double counterbored holes 1350 each having an upper section 1350a in the upper wall 1310, a lower section 1350c in the lower wall 1330 and a middle section 1350b with a smaller diameter than the upper and lower sections 1350a and 1350c. The holes 1350 preferably are evenly spaced azimuthally. The upper ring 1300 preferably has three twist-and-lock bores 1360 in the upper wall 1310, the twist-and-lock bores 1360 adapted to engage with vertically movable plungers mounted in a top wall of a plasma processing chamber such that the plasma confinement ring assembly 20 is supported by the plungers by inserting free ends of the plungers in the twist-and-lock bores 1360 and rotating the plasma confinement ring assembly 20 to lock the plungers in narrow ends of the twist-and-lock bores 1360. Details of a cam-based arrangement for supporting and operating the plungers can be found in commonly-owned U.S. Pat. No. 6,019,060, the disclosure of which is hereby incorporated by reference. The bores 1360 have an internal depth sufficient to allow heads of the plungers to move vertically down into the bores to accommodate vertical movement of the upper ring 1300 when a lower ring 1500 engages the lower electrode assembly during a gap adjustment and lifts the upper ring 1300 when upper projections on the hangers reach the limit of their travel in the lower section 1350c of bores 1350. See, for example, commonly-owned U.S. Pat. No. 6,926,803, the disclosure of which is hereby incorporated by reference. The upper ring 1300 further preferably has a thermal choke 1370. The thermal choke 1370 comprises a plurality of inner slots 1371 arranged in a discontinuous first circular pattern, and a plurality of outer slots 1372 spaced outwardly from the inner slots 1371 and arranged in a concentric discontinuous second circular pattern. Adjacent inner slots 1371 are separated by inner regions 1373, and adjacent outer slots 1372 are separated by outer regions 1374. As shown in FIG. 9A, the inner regions 1373 and outer regions 1374 are offset from each other around the upper plasma confinement ring 1300. The inner slots 1371 and the outer slots 1372 preferably extend completely through the thickness of the plasma confinement ring 1300 (i.e. between the upper wall 1310 and the lower wall 1330). This construction and placement of the thermal choke 1370 reduces radial heat dissipation from the inner wall 1320 so that the inner wall 1320 reaches a sufficiently high temperature to substantially prevent polymer deposition thereon during plasma processing. The inner slots 1371 and outer slots 1372 preferably have a width of from about 0.05 inch to about 0.2 inch. The upper ring 1300 preferably has an inner diameter of about 17 inches and a height from about 1 to 2 inches.

Figure 10A:
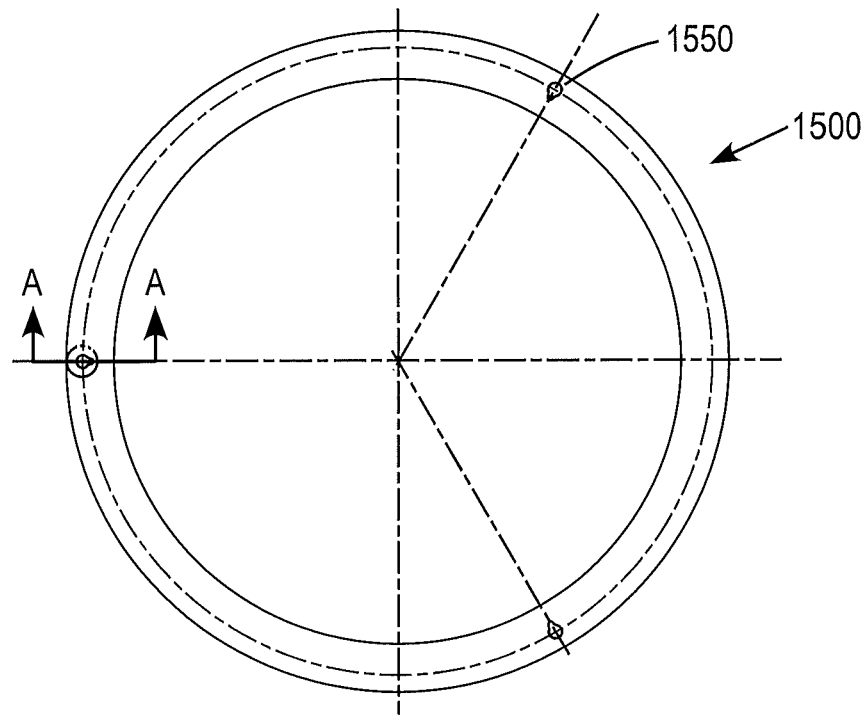
FIGS. 10A-B show details of a modified lower ring 1500 wherein FIG. 10A id a top view of the lower ring and FIG. 10B is a cross section taken in a radial plane passing through the center axis of the lower ring.
Figure 10B:
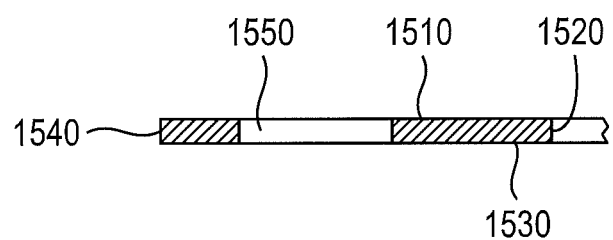

FIGS. 10A-B show details of the lower ring 1500 according to an embodiment. The lower ring 1500 has an upper wall 1510, an inner wall 1520, a lower wall 1530 and an outer wall 1540. The lower ring 1500 further has three through key-hole shaped holes 1550 extending from the upper wall 1510 to the lower wall 1530 and corresponding to the three double counterbored holes 1350 in the upper ring 1300. The holes 1550 have a larger diameter portion with a diameter of about 0.42 inch located on a radius of about 8.5 inches from the center of the lower ring 1500. Each hole 1550 includes a narrow slot extending radially inward with a width of about 0.175 inch and an inner end of the slot has a diameter of about 0.175 inch located on a radius of about 8.22 inches from the center of the lower ring 1500. The lower ring 1500 preferably has a thickness of about 0.005 to 0.1, preferably about 0.01 inch and is made of a dielectric material such as semiconductor processing compatible PEEK. The lower ring 1500 preferably has about the same inner diameter as the upper ring 1300. The lower ring 1500 is preferably made of an electrically insulating material such as quartz.

Figure 11A:
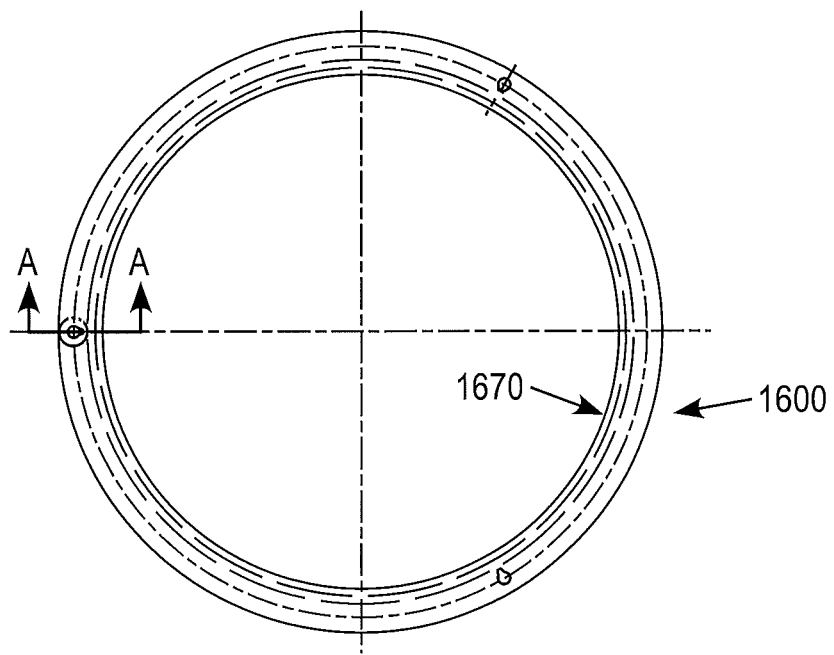
Figure 11B:
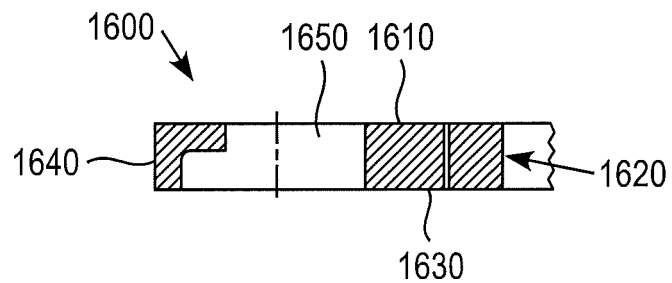
Figures 11C, 11D:
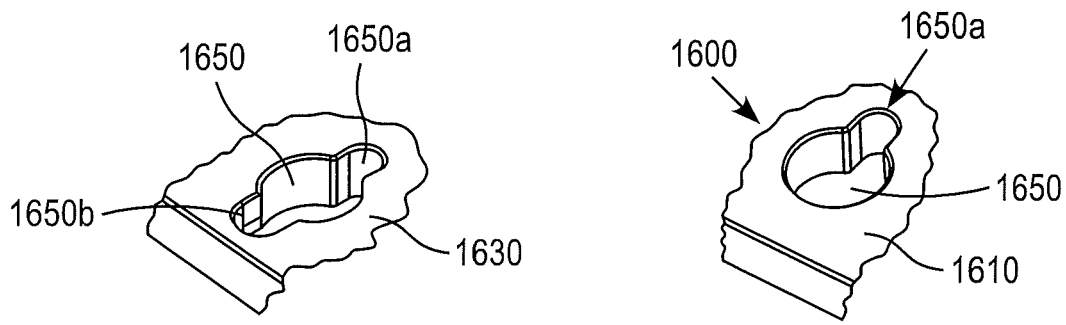
Figure 11E:
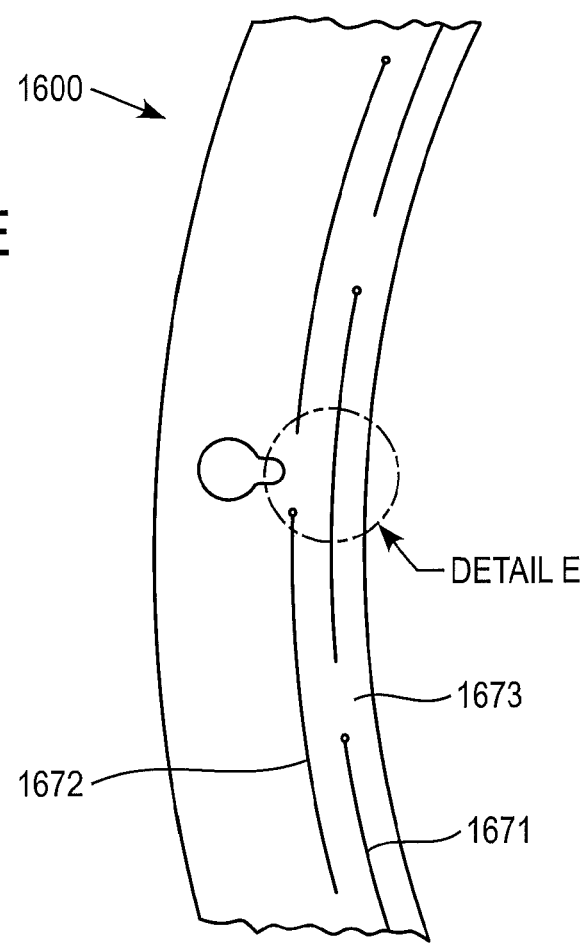
Figure 11F:
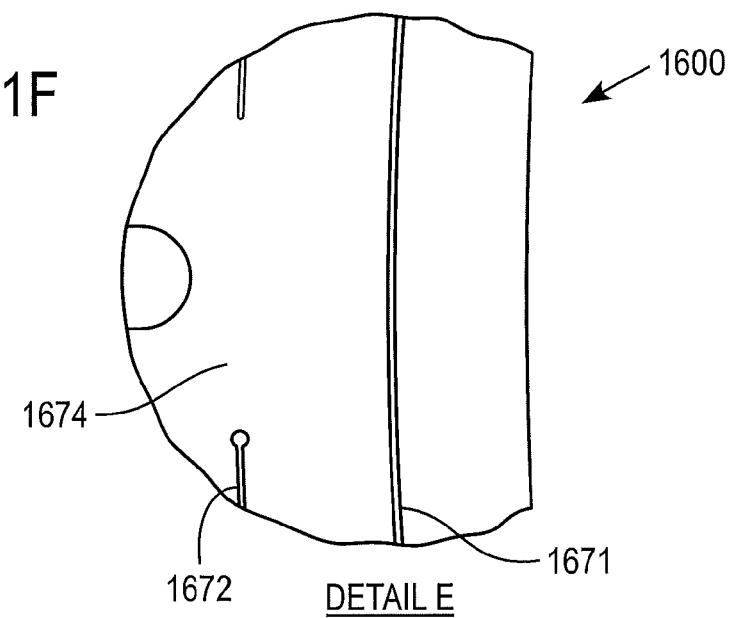

FIG. 11A—show details of the middle ring 1600 according to an embodiment. The middle ring 1600 has an upper wall 1610, an inner wall 1620, a lower wall 1630 and an outer wall 1640. The middle ring 1600 further has three keyhole-shaped through holes 1650 extending from the upper wall 1610 to the lower wall 1630 and corresponding to the three double counterbored holes 1350 in the upper ring 1300. The holes 1650 have a larger diameter portion with a diameter of about 0.42 inch located on a radius of about 8.5 inches from the center of the middle ring 1600. AS shown in FIG. 11C, each hole 1650 includes a narrow slot 1650a extending radially inward with a width of about 0.175 inch and an inner end of the slot has a diameter of about 0.175 inch located on a radius of about 8.22 inches from the center of the middle ring 1600. As shown in FIG. 11D, a slot 1650b diametrically opposite slot 1650a extends into the bottom surface 1630 and partially through the thickness of the middle ring 1600. The slot 1650b has a width of about 0.23 inch and an outer end of the slot has a diameter of about 0.23 inch located on a radius of about 8.725 inches from the center of the middle ring. The middle ring 1600 preferably has a thickness of about 0.25 to about 0.3 inch, preferably about 0.27 inch and is made of a dielectric material such as semiconductor processing compatible PEEK. The middle ring 1600 preferably has about the same inner diameter as the upper ring 1300, preferably about 8.565 inches. The middle ring 1600 further preferably has a thermal choke 1670. The thermal choke 1670 comprises a plurality of inner slots 1671 arranged in a discontinuous first circular pattern, and a plurality of outer slots 1672 spaced outwardly from the inner slots 1671 and arranged in a concentric discontinuous second circular pattern. Adjacent inner slots 1671 are separated by inner regions 1673, and adjacent outer slots 1672 are separated by outer regions 1674. As shown in FIG. 11E, the inner regions 1673 and outer regions 1674 are offset from each other around the middle ring 1600. The inner slots 1671 and the outer slots 1672 preferably extend completely through the thickness of the middle ring 1600 (i.e. between the upper wall 1610 and the lower wall 1630). This construction and placement of the thermal choke 1670 reduces radial heat dissipation from the inner wall 1620 so that the inner wall 1620 reaches a sufficiently high temperature to substantially prevent polymer deposition thereon during plasma processing. The inner slots 1671 and outer slots 1672 preferably have a width of from about 0.05 inch to about 0.2 inch, more preferably about 0.01 inch. In a preferred arrangement, 36 inner slots and 36 outer slots are arranged such that each slot extends 16.5° and ends of adjacent slots are spaced apart by 3.5°, the inner slots on a radius of about 8.788 inches and the outer slots on a radius of about 9.05 inches from the center of the middle ring 1600. One or both ends of the slots can be round holes having a diameter of about 0.015 inch. The upper ring 1300 preferably has an inner diameter of about 17 inches. The middle ring 1600 is preferably made of an electrically insulating material such as quartz.

Figure 12A:
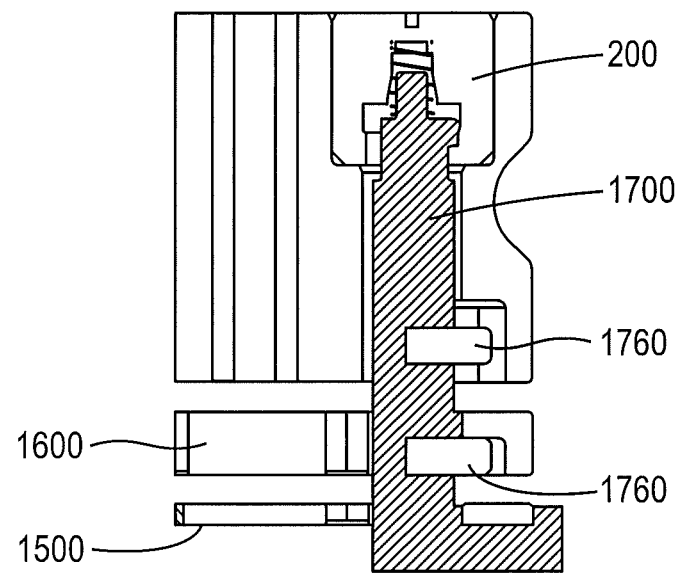
Figure 12B:
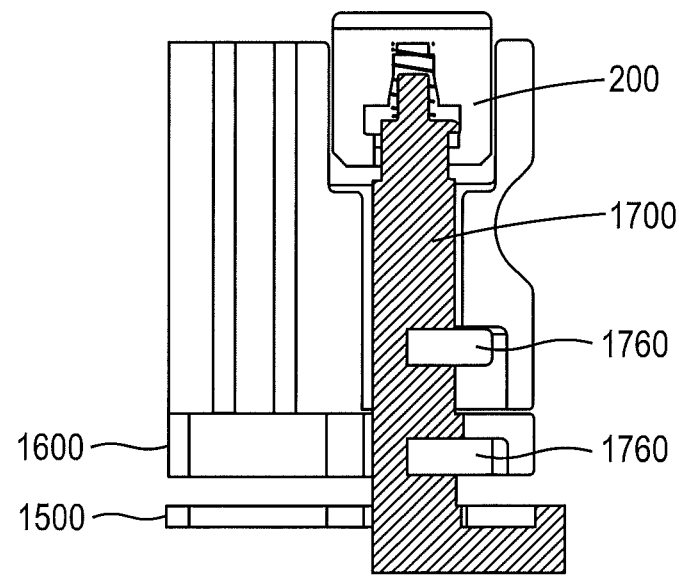
Figure 14A:
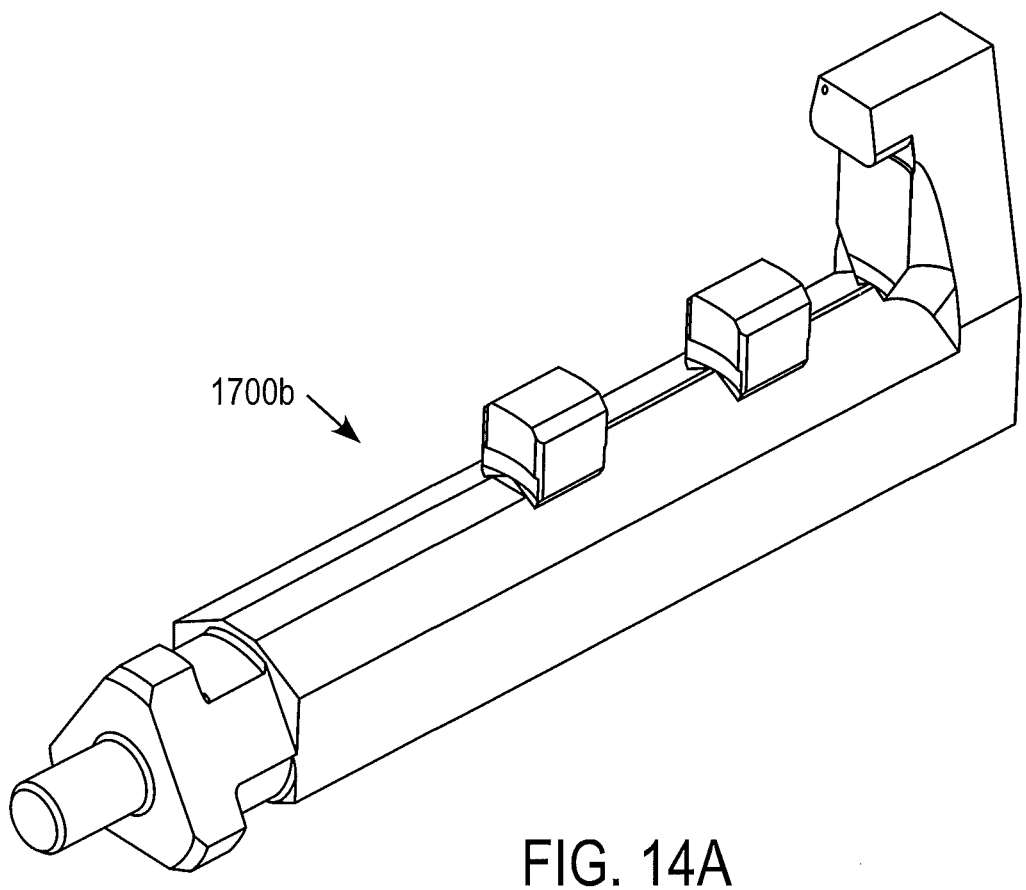
Figure 14B:
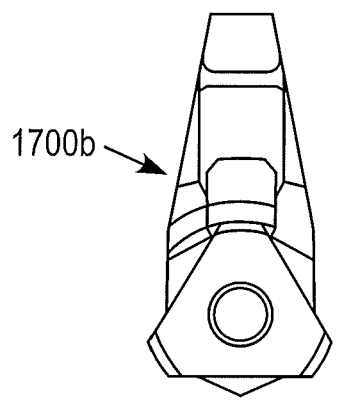
Figure 14C:
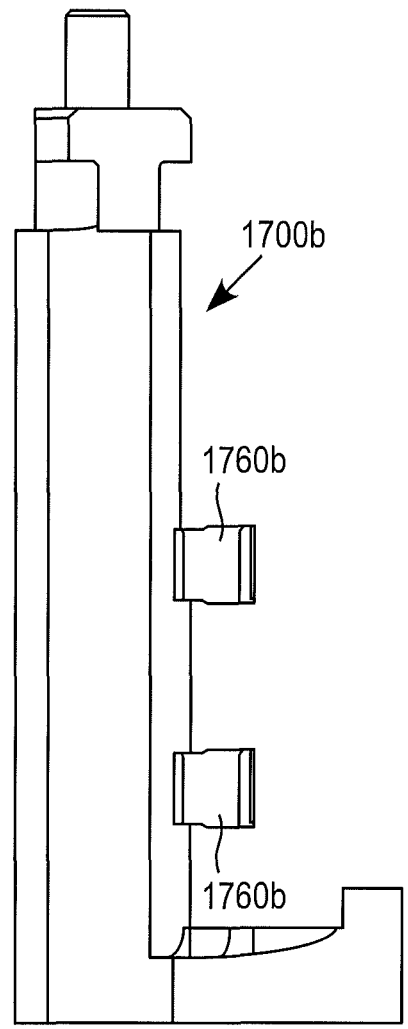
Figure 14D:
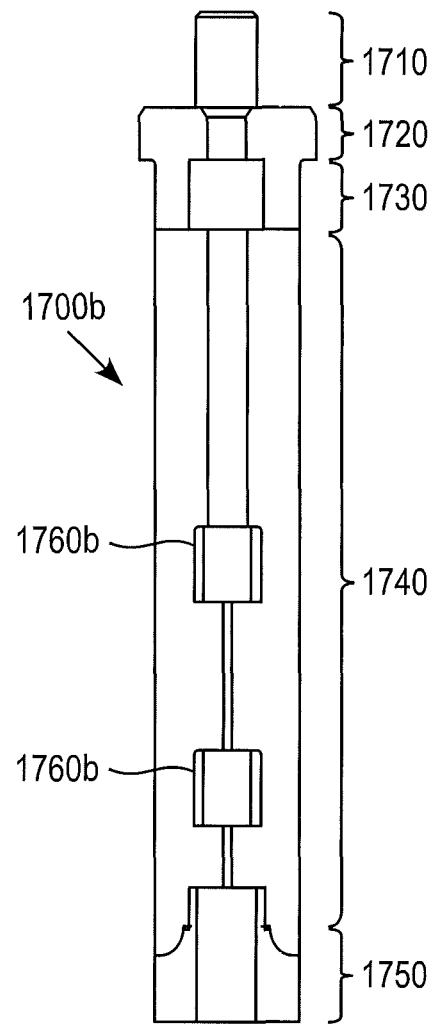

In this embodiment, the spacer sleeves 400 are omitted and instead a modified hanger 1700 is used which includes projections 1760 for engaging the middle ring 1600 and the lower bore 1350c in the upper ring 1300. FIG. 12A shows the modified hanger 1700 engaging the lower ring 1500, the middle ring 1600 and the upper ring 1300 in an open position and FIG. 12B shows the same arrangement in the closed position. The hanger 1700 includes upper and lower projections 1760, the upper projection engaging the top wall of bore 350c when the rings are in the closed position and the lower projection engaging the slot 1650b in the middle ring 1600. The projections 1760 can be separate pins which are press fitted in holes in the hanger 1700 or the projections can be an integral part of the hanger 1700.

FIGS. 13A-D show details of hanger 1700a having projections in the form of separate pins 1760a. The hanger 1700a has, from top to bottom, a first cylindrical section 1710, a second truncated triangular prism section 1720, a third truncated triangular prism section 1730 which is smaller than the second section 1720, a fourth cylindrical section 1740, and a fifth cylindrical section (i.e. the enlarged bottom section) 1750 which is larger in diameter than the fourth section. The hanger 1700a and the pins 1760a are preferably made of an electrically insulating material such as PEEK. An outer diameter of the fourth cylindrical section 1740 is preferably slightly smaller than the inner diameter of the middle section 1350b of the hole 1350 in the upper ring 1300 such that the hanger 1700a can slide in the hole 1350 without rubbing of opposed surfaces. In contrast to the first embodiment wherein the lower ring is supported on washers, hanger 1700a includes an L-shaped flange 1770 with a projection 1770a at its outer end which en gages an outer periphery of the lower ring 1500 and the portion of the hanger 1770a above the flange 1770 fits through the hole 1550 in the lower ring 1500. The projections 1760a are preferably arranged such that the upper surface of the lower projection is about 0.3 to 0.4 inch, preferably about 0.35 inch above the upper surface of flange 1770 and the upper projection can be located 0.4 to 0.5 inch, preferably 0.45 inch above the upper surface of the flange 1770. The projections 1760a can be cylindrical pins having a diameter of about 0.1 to 0.2 inch, preferably about 0.16 inch and the pins can have a length of about 0.35 inch. The pins can be press fitted into holes in the hanger 1700a such that the pins extend about 0.15 inch beyond the outer surface of the hanger 1700a. The length of section 1750 (distance between the bottom and top surfaces of the flange 1770) can be about 0.2 inch, the length of section 1740 can be about 1.45 inches, the length of section 1730 can be about 0.145 inch, the length of section 1720 can be about 0.110 inch, and the length of section 1710 can be about 0.2 inch and diameter of section 1710 can be about 0.13 inch.

FIGS. 14A-D show details of hanger 1700b having projections in the form of integral projections 1760b. The hanger 1700b has, from top to bottom, a first cylindrical section 1710, a second truncated triangular prism section 1720, a third truncated triangular prism section 1730 which is smaller than the second section 1720, a fourth cylindrical section 1740, and a fifth cylindrical section (i.e. the enlarged bottom section) 1750 which is larger in diameter than the fourth section. The hanger 1700b with the integral projections 1760b is preferably made of an electrically insulating material such as PEEK. An outer diameter of the fourth cylindrical section 1740 is preferably slightly smaller than the inner diameter of the middle section 1350b of the hole 1350 in the upper ring 1300 such that the hanger 1700b can slide in the hole 1350 without rubbing of opposed surfaces. In contrast to the first embodiment wherein the lower ring is supported on washers, hanger 1700b includes an L-shaped flange 1770 with a projection 1770b at its outer end which en gages an outer periphery of the lower ring 1500 and the portion of the hanger 1770b above the flange 1770 fits through the hole 1550 in the lower ring 1500. The projections 1760b are preferably arranged such that the upper surface of the lower projection is about 0.3 to 0.4 inch, preferably about 0.35 inch above the upper surface of flange 1770 and the upper projection can be located 0.4 to 0.5 inch, preferably 0.45 inch above the upper surface of the flange 1770. To provide additional strength to the projections 1760b, they can be rectangular in shape with a width of about 0.1 to 0.2 inch, preferably about 0.14 inch and a length of about 0.1 to 0.2 inch, preferably about 0.16 inch. The length of section 1750 (distance between the bottom and top surfaces of the flange 1770) can be about 0.2 inch, the length of section 1740 can be about 1.45 inches, the length of section 1730 can be about 0.145 inch, the length of section 1720 can be about 0.110 inch, and the length of section 1710 can be about 0.2 inch and diameter of section 1710 can be about 0.13 inch.

The embodiment shown in FIGS. 9-14 minimizes contact between the hangers and the confinement rings and areas of parts that come into rubbing contact are located on a side of the hanger opposite to where plasma is generated in the chamber. The addition of the middle ring with slots acting as thermal breaks operates to keep plasma exposed surfaces hot to prevent deposition of etch byproducts which can lead to particle and wafer contamination problems. The design of the parts minimizes contact of parts made of PEEK.

While the plasma confinement ring assembly and its components have been described in detail with reference to specific embodiments thereof, it will be apparent to those skilled in the art that various changes and modifications can be made, and equivalents employed, without departing from the scope of the appended claims.

We claim:

1. A plasma confinement ring assembly useful for controlling wafer area pressure in a capacitively coupled plasma reaction chamber wherein a wafer is supported on a lower electrode assembly and process gas is introduced into the chamber by an upper showerhead electrode assembly, comprising:

an upper ring having an upper wall, a lower wall, an outer wall, an inner wall, a series of circumferentially extending slots which pass through the upper and lower walls, a plurality of twist and lock bores in the upper wall adapted to engage with vertically movable plungers mounted in a top wall of the plasma reaction chamber such that the upper ring is supported by the plungers by inserting free ends of the plungers in the twist and lock bores and rotating the upper ring to lock the plungers in narrow ends of the twist and lock bores, a plurality of hanger bores extending between the upper and lower walls, the hanger bores including larger upper and lower sections connected by a smaller central section;

a plurality of hanger caps located in the upper sections of the hanger bores, each hanger cap including a stepped bore in a lower wall thereof and a helical spring press fitted in a small diameter upper section of the stepped bore;

a plurality of hangers located in the lower sections of the hanger bores with an upper end of each hanger fitted in one of the hanger caps such that the helical spring is compressed, the hangers movable vertically with respect to the hanger caps and rotatable to lock positions, each of the hangers including at least one projection adapted to rotate in the hanger cap to engage a seat in the hanger cap, each hanger including a lower section having an enlarged lower end;

a lower ring having an upper wall, a lower wall, an outer wall, an inner wall and a plurality of through bores extending through the upper and lower walls, each of the hangers having a lower section thereof received in one of the through bores, the lower ring having inner and outer diameters equal to inner and outer diameters of the upper ring and a uniform thickness of about 0.090 to 0.1 inch; and a plurality of spacer sleeves each of which includes an upper wall, a lower wall, an outer wall, an inner wall and a through hole extending between the upper and lower walls, each of the spacer sleeves located in the lower section of a respective one of the hanger bores, each of the hangers extending through one of the respective through holes;

wherein the outer wall of the hanger cap is separated from an inner wall of the upper section of the hanger bore by at least 0.01 inch, the spacer sleeve is spaced from an inner wall of the lower section of the hanger bore by at least 0.1 inch, and the outer surface of the hanger is spaced from the inner wall of the smaller diameter section of the hanger bore by at least 0.1.

2. The assembly of claim 1, wherein each hanger includes three radial projections and each hanger cap includes three axially extending grooves, the grooves sized to allow vertical insertion of the three radial projections of the hanger to an upper position at which the helical spring is compressed, each hanger cap including three seats which receive the radial projections in the locked position.

3. The assembly of claim 1, wherein the upper ring includes six inner circumferential slots located on a first radius located outward of the inner wall and six outer circumferential slots located on a second radius located inward of the outer wall.

4. The assembly of claim 1, further comprising:
a plurality of washers wider than the width of the lower ring, each of the washers having a central opening receiving a lower section of one of the hangers and being located between the enlarged lower end of the hanger and the lower wall of the lower ring;
wherein each washer is entirely polyetheretherketone with an outer diameter of about 1.25.

5. The assembly of claim 1, further comprising a middle ring located between the upper ring and the lower ring, each hanger including a flange at a lower end thereof which supports the lower ring, a lower projection which supports the middle ring and an upper projection which limits upward travel of the hanger in the lower section of the hanger bore in the upper ring.

6. The assembly of claim 1, wherein:
each of the hangers is entirely polyetheretherketone with an axial length of about 2 inches, each hanger including a spindle section having an axial length of about 1.6 inch and diameter of about 0.4 inch, a flange at a lower end of the spindle section with an axial length of about 0.15 inch, an upper spindle section with an axial length of about 0.2 inch and diameter of about 0.13 inch, an upper triangular section below the upper spindle section with an axial length of about 0.11 inch and maximum width of about 0.39 inch, a lower triangular section below the upper triangular section with an axial length of about 0.145 inch and maximum width of about 0.3 inch.

7. The assembly of claim 1, wherein the upper ring has parallel inner and outer sidewalls and parallel upper and lower walls which are perpendicular to the sidewalls.

8. The assembly of claim 1, wherein the upper ring is sized to have a gap between its inner wall and an outer wall of an upper electrode assembly when the upper ring is supported by plungers, the upper ring having an inner diameter of about 17 inches, an outer diameter of about 20 inches and a thickness of about 1.5 to about 2 inches.

9. The assembly of claim 8, wherein the upper ring includes three twist-and-lock blind bores located on a radius of about 9.2 inches and three hanger bores sized to receive hangers therein located on a radius of about 9.4 to about 9.5 inches.

10. The assembly of claim 9, wherein the twist-and-lock bores have a wide diameter portion sized to allow a plunger having an enlarged head to enter the bore and a narrow portion offset 5° from the wide portion, the wide portion and narrow portion connected by an annular channel sized to allow movement of the enlarged head of the plunger from the entry position to a locked position at which a smaller diameter portion of the plunger is located in the narrow portion of the bore, the channel having a vertical step which prevents the head of the plunger from moving towards the wide portion of the bore unless the plunger is depressed relative to the upper wall of the upper ring.

11. The assembly of claim 9, wherein:
the hanger bores have an upper section which is about 0.64 inch deep and about 0.75 inch in diameter, a lower section which is about 0.38 inch deep and about 0.75 inch in diameter, and a middle section which is about 0.925 inch in length and about 0.41 inch in diameter.

12. The assembly of claim 8, wherein the upper ring includes six inner slots and six outer slots located between the inner wall and the middle radius of the upper ring, each of the slots extending circumferentially about 48° with ends of the inner slots spaced about 12° apart, ends of three adjacent pairs of the outer slots spaced about 4° at three first locations 120° apart or 20° apart at three second locations 45° offset from the first locations, are spaced by 20°.

13. The assembly of claim 1, wherein the hangers have a length of about 2 inches and include four sections with different cross sections, the first section is an upper cylindrical section about 0.2 inch in length and 0.13 inch in diameter, the second section is a triangular section about 0.255 inch in length with three planar walls parallel to a center axis of the hanger located about 0.125 inch from the center axis, the three walls having equal widths and oriented 60° with respect to each other, upper ends of the of the three walls are wider than lower ends of the walls to form three projections extending about 0.2 inch from the center axis of the hanger, the planar walls are T-shaped and lower ends of the planar walls are connected by cylindrical wall sections having a vertical length of about 0.145 inch and a diameter of about 0.3 inch, the third section is cylindrical with a length of about 1.45 inches and a diameter of about 0.4 inch, the fourth section is cylindrical and has a length of about 0.15 inch and a diameter larger than the third section.

14. The assembly of claim 4, wherein the spacer sleeve is cylindrical with a length of about 0.39 inch, outer diameter of about 0.67 inch and inner diameter of about 0.41 inch, upper and lower edges of the spacer including 45° chamfers extending about 0.04 inch and the washers have an outer diameter of about 1.25 inches, an inner diameter of about 0.42 inch and thickness of about 0.01 inch.

15. The assembly of claim 5, wherein the middle ring has a thickness of about 0.27 inch, an inner diameter of about 17 inches and an outer diameter of about 20 inches, three hanger receiving keyhole shaped holes each of which has a diameter of about 0.42 inch located on a radius of about 8.5 inches and a slot extending radially inward therefrom with a width of about 0.175 inch, three seats in a lower surface of the middle ring each of which extends radially outward from each of the keyhole shaped holes, each of the seats having a width of about 0.23 inch and depth of about 0.15 to 0.2 inch, a heat choke comprising thirty six inner slots and thirty six outer slots, the inner slots being located on a radius of about 8.8 inches and the outer slots being located on a radius of about 9 inches, each of the slots extending circumferentially about 16.5° with ends of the slots spaced about 3.5° apart, and at least one end of each slot terminating in a circular hole having a radius of about 0.015 inch.

16. The assembly of claim 1, wherein:
the lower ring has an outer diameter of about 20 inches, in inner diameter of about 17 inches, a thickness of about 0.09 inch and three holes having a diameter of about 0.42 inch, located on a radius of about 9.44 inches and spaced 120° apart.

17. An upper ring of a plasma confinement ring assembly useful for controlling wafer area pressure in a capacitively coupled plasma reaction chamber wherein a wafer is supported on a lower electrode assembly and process gas is introduced into the chamber by an upper showerhead electrode assembly, wherein:
the upper ring has an upper wall, a lower wall, an outer wall, an inner wall, a series of circumferentially extending slots which pass through the upper and lower walls, a plurality of twist and lock bores in the upper wall adapted to engage with vertically movable plungers mounted in a top wall of the plasma reaction chamber such that the upper ring is supported by the plungers by inserting free ends of the plungers in the twist and lock bores and rotating the upper ring to lock the plungers in narrow ends of the twist and lock bores, a plurality of hanger bores extending between the upper and lower walls, the hanger bores including larger upper and lower sections connected by a smaller diameter central section;
wherein lower sections of each of the hanger bores are configured to locate a respective spacer sleeve therein and a respective inner wall of each of the lower sections of the respective hanger bores are configured to be spaced from the respective spacer sleeves by at least 0.1 inch when the respective spacer sleeves are located in the respective lower sections of each of the hanger bores.

18. A hanger assembly of a plasma confinement ring assembly useful for controlling wafer area pressure in a capacitively coupled plasma reaction chamber wherein a wafer is supported on a lower electrode assembly and process gas is introduced into the chamber by an upper showerhead electrode assembly, comprising:
a hanger cap configured to fit in an upper sections of a hanger bore in an upper ring of the plasma confinement ring assembly, the hanger cap including a stepped bore in a lower wall thereof and a helical spring press fitted in a small diameter upper section of the stepped bore; and
a hanger configured to fit in a lower section of the hanger bore in the upper ring of the plasma confinement ring assembly, the hanger having an upper end configured to fit in the stepped bore of the hanger cap such that the helical spring is compressed, the hanger being movable vertically with respect to the hanger cap and rotatable to a lock position, the hanger including at least one projection adapted to rotate in the stepped bore of the hanger cap to engage a seat in the hanger cap, and the hanger including a lower section having an enlarged lower end;
wherein the hanger includes a spindle section having an axial length of about 1.6 inch and diameter of about 0.4 inch, a flange at a lower end of the spindle section with an axial length of about 0.15 inch, an upper spindle section with an axial length of about 0.2 inch and diameter of about 0.13 inch, an upper triangular section below the upper spindle section with an axial length of about 0.11 inch and maximum width of about 0.39 inch, a lower triangular section below the upper triangular section with an axial length of about 0.145 inch and maximum width of about 0.3 inch.

19. The hanger assembly of claim 18, further comprising:
a spacer sleeve which includes an upper wall, a lower wall, an outer wall, an inner wall and a through hole extending between the upper and lower walls, the spacer sleeve configured to fit in the lower section of the hanger bore with the hanger extending through the through hole.

20. The hanger assembly of claim 18, wherein the hanger includes a projection configured to fit within the lower section of the hanger bore and during upward movement of the hanger the projection does not contact surfaces of the hanger bore until an upper surface of the projection comes into contact with a horizontal surface of the hanger bore.

21. The assembly of claim 1, wherein each of the hangers is entirely polyetheretherketone with an axial length of about 2.1 inches, each hanger including a six sided spindle section having an axial length of about 1.6 inch with two parallel side surfaces about 0.3 inch apart, two angled surfaces meeting at an angle of about 120° and two angled surfaces meeting at an angle of about 130° with a maximum width of the angled surfaces of about 0.35 inch, a flange at a lower end of the spindle section with an axial length of about 0.15 inch and extending about 0.43 inch from the outer surface of the six sided spindle section, an upper spindle section with an axial length of about 0.2 inch and diameter of about 0.13 inch, an upper triangular section below the upper spindle section with an axial length of about 0.11 inch and maximum width of about 0.39 inch, a lower triangular section below the upper triangular section with an axial length of about 0.145 inch and maximum width of about 0.3 inch, the hanger including a lower projection having an upper surface about 0.37 inch from an upper surface of the flange and an upper projection having an upper surface about 0.47 inch above the upper surface of the lower projection.

22. The assembly of claim 9, wherein the hanger bores have an upper section which is about 0.64 inch deep and about 0.69 inch in diameter, a lower keyhole shaped section which is about 0.34 inch deep and includes an inner portion about 0.42 inch in diameter in axial alignment with the center axis of the upper section and an outer slot shaped section with a width of about 0.23 inch, and a middle section which is about 0.57 inch in length and about 0.42 inch in diameter in axial alignment with the center axis of the upper section.

23. The assembly of claim 1, wherein the lower ring has an outer diameter of about 20 inches, in inner diameter of about 17 inches, a thickness of about 0.09 inch and three keyhole shaped holes having an outer portion with a diameter of about 0.42 inch, located on a radius of about 9.5 inches and spaced 120° apart and an inner slot shaped portion having a width of about 0.35 inch.

* * * * *